(12) United States Patent
Nakatani et al.

(10) Patent No.: US 11,710,941 B2
(45) Date of Patent: Jul. 25, 2023

(54) SEMICONDUCTOR LASER ELEMENT

(71) Applicant: Nuvoton Technology Corporation Japan, Kyoto (JP)

(72) Inventors: Tougo Nakatani, Toyama (JP); Masayuki Hata, Osaka (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 383 days.

(21) Appl. No.: 17/157,660

(22) Filed: Jan. 25, 2021

(65) Prior Publication Data
US 2021/0167582 A1 Jun. 3, 2021

Related U.S. Application Data

(63) Continuation of application No. PCT/JP2019/027857, filed on Jul. 16, 2019.

(30) Foreign Application Priority Data

Jul. 27, 2018 (JP) ................................. 2018-141109

(51) Int. Cl.
*H01S 5/32* (2006.01)
*H01S 5/20* (2006.01)
*H01S 5/343* (2006.01)
*H01S 5/02* (2006.01)
*H01S 5/22* (2006.01)

(52) U.S. Cl.
CPC .......... *H01S 5/3216* (2013.01); *H01S 5/0206* (2013.01); *H01S 5/2009* (2013.01); *H01S 5/2031* (2013.01); *H01S 5/22* (2013.01); *H01S 5/34313* (2013.01)

(58) Field of Classification Search
CPC ..................................................... H01S 5/3216
See application file for complete search history.

(56) References Cited

U.S. PATENT DOCUMENTS 5,717,707 A * 2/1998 Beernink ............ H01S 5/34326
372/45.01
2002/0171094 A1 11/2002 Koiso et al.
(Continued)

FOREIGN PATENT DOCUMENTS

JP 2006-186250 A 7/2008
JP 2014-212186 A 11/2014
(Continued)

OTHER PUBLICATIONS

International Search Report issued in corresponding in International Patent Application No. PCT/JP2019/027857, dated Oct. 8, 2019, with English translation.

*Primary Examiner* — Tuan N Nguyen
(74) *Attorney, Agent, or Firm* — McDermott Will & Emery LLP

(57) ABSTRACT

A semiconductor laser element includes: an n-type cladding layer disposed above an n-type semiconductor substrate (a chip-like substrate); an active layer disposed above the n-type cladding layer; and a p-type cladding layer disposed above the active layer, in which the active layer includes a well layer and a barrier layer, an energy band gap of the barrier layer is larger than an energy band gap of the n-type cladding layer, and a refractive index of the barrier layer is higher than a refractive index of the n-type cladding layer.

20 Claims, 23 Drawing Sheets

(56) References Cited

U.S. PATENT DOCUMENTS

2002/0195606 A1* 12/2002 Edmond ............... B82Y 20/00
                                                    257/79
2020/0169058 A1    5/2020 Sato et al.

FOREIGN PATENT DOCUMENTS

WO         02/21578 A1    3/2002
WO      2019/026953 A1    2/2019

* cited by examiner

FIRST DIRECTION →

FIG. 14

| LAYER STRUCTURE | COMPOSITION | FILM THICKNESS (μm) |
|---|---|---|
| P-TYPE CONTACT LAYER 256 | p-GaAs | 0.23 |
| P-TYPE INTERLAYER 255 | p-$(Al_{0.1}Ga_{0.9})_{0.5}In_{0.5}P$ | 0.106 |
| P-TYPE THIRD CLADDING LAYER 254 | p-$(Al_{0.3}Ga_{0.7})_{0.5}In_{0.5}P$ | 0.6 |
| P-TYPE SECOND CLADDING LAYER 253 | p-$(Al_{0.6}Ga_{0.4})_{0.5}In_{0.5}P$ | 0.4 |
| P-TYPE FIRST CLADDING LAYER 252 | p-$(Al_{0.3}Ga_{0.7})_{0.5}In_{0.5}P$ | 0.18 |
| P-SIDE LIGHT GUIDE LAYER 251 | $Ga_{0.5}In_{0.5}P$ | 0.07 |
| BARRIER LAYER 245 | $Al_{0.59}Ga_{0.41}As$ | 0.021 |
| WELL LAYER 244 | $In_{0.03}Ga_{0.97}As$ | 0.0055 |
| BARRIER LAYER 243 | $Al_{0.59}Ga_{0.41}As$ | 0.004 |
| WELL LAYER 242 | $In_{0.03}Ga_{0.97}As$ | 0.0055 |
| BARRIER LAYER 241 | $Al_{0.59}Ga_{0.41}As$ | 0.024 |
| N-SIDE LIGHT GUIDE LAYER 233 | $Ga_{0.5}In_{0.5}P$ | 0.09 |
| N-TYPE CLADDING LAYER 232 | n-$(Al_{0.17}Ga_{0.83})_{0.5}In_{0.5}P$ | 4.7 |
| N-TYPE BUFFER LAYER 231 | n-GaAs | 0.4 |
| CHIP-LIKE SUBSTRATE 224 | n-GaAs | - |

FIG. 16

| LAYER STRUCTURE | COMPOSITION | FILM THICKNESS (μm) |
|---|---|---|
| P-TYPE CONTACT LAYER 356 | p-GaAs | 0.23 |
| P-TYPE INTERLAYER 355 | p-$(Al_{0.1}Ga_{0.9})_{0.5}In_{0.5}P$ | 0.106 |
| P-TYPE THIRD CLADDING LAYER 354 | p-$(Al_{0.3}Ga_{0.7})_{0.5}In_{0.5}P$ | 0.6 |
| P-TYPE SECOND CLADDING LAYER 353 | p-$(Al_{0.6}Ga_{0.4})_{0.5}In_{0.5}P$ | 0.4 |
| P-TYPE FIRST CLADDING LAYER 352 | p-$(Al_{0.3}Ga_{0.7})_{0.5}In_{0.5}P$ | 0.16 |
| P-SIDE LIGHT GUIDE LAYER 351 | $Ga_{0.5}In_{0.5}P$ | 0.07 |
| BARRIER LAYER 347 | $Al_{0.59}Ga_{0.41}As$ | 0.021 |
| WELL LAYER 346 | $GaAs_{0.84}P_{0.16}$ | 0.0065 |
| BARRIER LAYER 345 | $Al_{0.59}Ga_{0.41}As$ | 0.008 |
| WELL LAYER 344 | $GaAs_{0.84}P_{0.16}$ | 0.0065 |
| BARRIER LAYER 343 | $Al_{0.59}Ga_{0.41}As$ | 0.008 |
| WELL LAYER 342 | $GaAs_{0.84}P_{0.16}$ | 0.0065 |
| BARRIER LAYER 341 | $Al_{0.59}Ga_{0.41}As$ | 0.04 |
| N-SIDE LIGHT GUIDE LAYER 333 | $Ga_{0.5}In_{0.5}P$ | 0.09 |
| N-TYPE CLADDING LAYER 332 | n-$(Al_{0.19}Ga_{0.81})_{0.5}In_{0.5}P$ | 4.7 |
| N-TYPE BUFFER LAYER 331 | n-GaAs | 0.4 |
| CHIP-LIKE SUBSTRATE 324 | n-GaAs | - |

FIG. 18

| LAYER STRUCTURE | COMPOSITION | FILM THICKNESS (μm) |
|---|---|---|
| P-TYPE CONTACT LAYER 456 | p-GaAs | 0.23 |
| GRADED INTERLAYER 457 | p-$Al_xGa_{1-x}As$ (x = 0.55 ~ 0.05) | 0.05 |
| P-TYPE INTERLAYER 455 | p-$(Al_{0.1}Ga_{0.9})_{0.5}In_{0.5}P$ | 0.106 |
| P-TYPE THIRD CLADDING LAYER 454 | p-$(Al_{0.3}Ga_{0.7})_{0.5}In_{0.5}P$ | 0.6 |
| P-TYPE SECOND CLADDING LAYER 453 | p-$(Al_{0.6}Ga_{0.4})_{0.5}In_{0.5}P$ | 0.4 |
| P-TYPE FIRST CLADDING LAYER 452 | p-$(Al_{0.3}Ga_{0.7})_{0.5}In_{0.5}P$ | 0.17 |
| P-SIDE LIGHT GUIDE LAYER 451 | $(Al_{0.04}Ga_{0.96})_{0.5}In_{0.5}P$ | 0.07 |
| BARRIER LAYER 445 | $Al_{0.59}Ga_{0.41}As$ | 0.021 |
| WELL LAYER 444 | GaAs | 0.0065 |
| BARRIER LAYER 443 | $Al_{0.59}Ga_{0.41}As$ | 0.004 |
| WELL LAYER 442 | GaAs | 0.0065 |
| BARRIER LAYER 441 | $Al_{0.59}Ga_{0.41}As$ | 0.03 |
| N-SIDE LIGHT GUIDE LAYER 433 | $(Al_{0.04}Ga_{0.96})_{0.5}In_{0.5}P$ | 0.09 |
| N-TYPE CLADDING LAYER 432 | n-$(Al_{0.18}Ga_{0.82})_{0.5}In_{0.5}P$ | 4.7 |
| GRADED BUFFER LAYER 434 | n-$Al_xGa_{1-x}As$ (x = 0.05 ~ 0.35) | 0.075 |
| N-TYPE BUFFER LAYER 431 | n-GaAs | 0.4 |
| CHIP-LIKE SUBSTRATE 424 | n-GaAs | - |

FIG. 21

| LAYER STRUCTURE | COMPOSITION | FILM THICKNESS (μm) |
|---|---|---|
| P-TYPE CONTACT LAYER 556 | p-GaAs | 0.23 |
| GRADED INTERLAYER 557 | p-$Al_xGa_{1-x}As$ (x = 0.55 ~ 0.05) | 0.05 |
| P-TYPE INTERLAYER 555 | p-$(Al_{0.1}Ga_{0.9})_{0.5}In_{0.5}P$ | 0.106 |
| P-TYPE THIRD CLADDING LAYER 554 | p-$(Al_{0.3}Ga_{0.7})_{0.5}In_{0.5}P$ | 0.6 |
| P-TYPE SECOND CLADDING LAYER 553 | p-$(Al_{0.6}Ga_{0.4})_{0.5}In_{0.5}P$ | 0.4 |
| P-TYPE FIRST CLADDING LAYER 552 | p-$(Al_{0.3}Ga_{0.7})_{0.5}In_{0.5}P$ | 0.20 |
| P-SIDE LIGHT GUIDE LAYER 551 | $(Al_{0.04}Ga_{0.96})_{0.5}In_{0.5}P$ | 0.13 |
| BARRIER LAYER 545 | $Al_{0.59}Ga_{0.41}As$ | 0.021 |
| WELL LAYER 544 | $In_{0.17}Ga_{0.83}As$ | 0.008 |
| BARRIER LAYER 543 | $Al_{0.59}Ga_{0.41}As$ | 0.007 |
| WELL LAYER 542 | $In_{0.17}Ga_{0.83}As$ | 0.008 |
| BARRIER LAYER 541 | $Al_{0.59}Ga_{0.41}As$ | 0.03 |
| N-SIDE LIGHT GUIDE LAYER 533 | $(Al_{0.04}Ga_{0.96})_{0.5}In_{0.5}P$ | 0.085 |
| N-TYPE CLADDING LAYER 532 | n-$(Al_{0.165}Ga_{0.835})_{0.5}In_{0.5}P$ | 4.7 |
| GRADED BUFFER LAYER 534 | n-$Al_xGa_{1-x}As$ (x = 0.05 ~ 0.35) | 0.075 |
| N-TYPE BUFFER LAYER 531 | n-GaAs | 0.4 |
| CHIP-LIKE SUBSTRATE 524 | n-GaAs | - |

FIG. 23

| LAYER STRUCTURE | COMPOSITION | FILM THICKNESS (μm) |
|---|---|---|
| P-TYPE CONTACT LAYER 656 | p-GaAs | 0.23 |
| GRADED INTERLAYER 657 | p-$Al_xGa_{1-x}As$ (x = 0.55 ~ 0.05) | 0.05 |
| P-TYPE INTERLAYER 655 | p-$(Al_{0.1}Ga_{0.9})_{0.5}In_{0.5}P$ | 0.106 |
| P-TYPE THIRD CLADDING LAYER 654 | p-$(Al_{0.3}Ga_{0.7})_{0.5}In_{0.5}P$ | 0.6 |
| P-TYPE SECOND CLADDING LAYER 653 | p-$(Al_{0.6}Ga_{0.4})_{0.5}In_{0.5}P$ | 0.4 |
| P-TYPE FIRST CLADDING LAYER 652 | p-$(Al_{0.29}Ga_{0.71})_{0.5}In_{0.5}P$ | 0.17 |
| P-SIDE LIGHT GUIDE LAYER 651 | $(Al_{0.04}Ga_{0.96})_{0.5}In_{0.5}P$ | 0.13 |
| BARRIER LAYER 645 | $Al_{0.59}Ga_{0.41}As$ | 0.021 |
| WELL LAYER 644 | GaAs | 0.0065 |
| BARRIER LAYER 643 | $Al_{0.59}Ga_{0.41}As$ | 0.004 |
| WELL LAYER 642 | GaAs | 0.0065 |
| BARRIER LAYER 641 | $Al_{0.59}Ga_{0.41}As$ | 0.02 |
| N-SIDE LIGHT GUIDE LAYER 633 | $(Al_{0.04}Ga_{0.96})_{0.5}In_{0.5}P$ | 0.05 |
| N-TYPE CLADDING LAYER 632 | n-$(Al_{0.155}Ga_{0.845})_{0.5}In_{0.5}P$ | 3.2 |
| GRADED BUFFER LAYER 634 | n-$Al_xGa_{1-x}As$ (x = 0.05 ~ 0.35) | 0.075 |
| N-TYPE BUFFER LAYER 631 | n-GaAs | 0.4 |
| CHIP-LIKE SUBSTRATE 624 | n-GaAs | - |

SEMICONDUCTOR LASER ELEMENT

CROSS REFERENCE TO RELATED APPLICATIONS

This application is a U.S. continuation application of PCT International Patent Application Number PCT/JP2019/027857 filed on Jul. 16, 2019, claiming the benefit of priority of Japanese Patent Application Number 2018-141109 filed on Jul. 27, 2018, the entire contents of which are hereby incorporated by reference.

BACKGROUND

1. Technical Field

The present disclosure relates to a semiconductor laser element.

2. Description of the Related Art

Conventionally, a semiconductor laser element has been known as a small high-power light source (for example, see WO 2002/21578, etc.). In the design of such a semiconductor laser element, there is a demand for reduction in operating voltage to reduce power consumption or the like. In order to reduce the operating voltage, the semiconductor laser element disclosed in WO 2002/21578 is configured to have a larger energy band gap in a barrier layer included in an active layer than in an n-type cladding layer. With this, it is intended to suppress an increase in operating voltage by reducing a possible spike-like hetero barrier generated at the interface between the active layer and the n-type cladding layer.

SUMMARY

Here, in an AlGaAs-based semiconductor, it is known that the refractive index decreases as the energy band gap increases, but the refractive index increases as the energy band gap decreases.

Accordingly, when the active layer has an energy band gap larger than that of the n-type cladding layer to reduce the spike-like hetero barrier at the interface between the active layer and the n-type cladding layer, the n-type cladding layer has a refractive index higher than that of the active layer. This decreases the effect of confining light in the active layer, and thus the light emission characteristics deteriorate.

The present disclosure is conceived to solve such a problem. An object of the present disclosure is to provide a semiconductor laser element capable of achieving both low operating voltage and high light confinement effect.

In order to achieve the above object, a semiconductor laser element according to an aspect of the present disclosure includes: an n-type cladding layer disposed above an n-type semiconductor substrate; an active layer disposed above the n-type cladding layer; and a p-type cladding layer disposed above the active layer, in which the active layer includes a well layer and a barrier layer, an energy band gap of the barrier layer is larger than an energy band gap of the n-type cladding layer, and a refractive index of the barrier layer is higher than a refractive index of the n-type cladding layer.

Moreover, in the semiconductor laser element according to an aspect of the present disclosure, the n-type cladding layer may contain $Al_{x1}Ga_{1-x1-y1}In_{y1}As_{1-z1}P_{z1}$, the barrier layer may contain $Al_{x2}Ga_{1-x2-y2}In_{y2}As_{1-z2}P_{z2}$, and $z1>z2$ may be satisfied.

Moreover, in the semiconductor laser element according to an aspect of the present disclosure, the n-type cladding layer may contain $Al_{x1}Ga_{1-x1-y1}In_{y1}P$, and the barrier layer may contain $Al_{x2}Ga_{1-x2-y2}In_{y2}As$.

Moreover, in the semiconductor laser element according to an aspect of the present disclosure, $x1<x2$ may be satisfied.

Moreover, in the semiconductor laser element according to an aspect of the present disclosure, the n-type semiconductor substrate may contain GaAs.

Moreover, the semiconductor laser element according to an aspect of the present disclosure may further include an n-side light guide layer disposed between the n-type cladding layer and the active layer and having a refractive index higher than the refractive index of the n-type cladding layer.

Moreover, the semiconductor laser element according to an aspect of the present disclosure may further include a hole barrier layer disposed between the n-type cladding layer and the active layer and having an energy band gap larger than the energy band gap of the n-type cladding layer.

Moreover, in the semiconductor laser element according to an aspect of the present disclosure, an energy band gap of the p-type cladding layer may be larger than the energy band gap of the barrier layer.

Moreover, in the semiconductor laser element according to an aspect of the present disclosure, the energy band gap of the n-type cladding layer may be larger than an energy band gap of the n-type semiconductor substrate.

With the present disclosure, it is possible to provide a semiconductor laser element capable of achieving both low operating voltage and high light confinement effect.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 14 is a table illustrating the layer structure of a semiconductor laser element according to Embodiment 2;

FIG. 16 is a table illustrating the layer structure of a semiconductor laser element according to Embodiment 3;

FIG. 18 is a table illustrating the layer structure of a semiconductor laser element according to Embodiment 4;

FIG. 21 is a table illustrating the layer structure of the semiconductor laser element according to Embodiment 5;

FIG. 23 is a table illustrating the layer structure of a semiconductor laser element according to Embodiment 6.

DETAILED DESCRIPTION OF THE EMBODIMENTS

Hereinafter, embodiments of the present disclosure will be described. with reference to the drawings. It should be noted that each of the embodiments described below shows a specific example of the present disclosure. Therefore, numerical values, shapes, materials, structural components, the arrangement and connection of the structural components, etc. shown in the following embodiments are mere examples, and are not intended to limit the scope of the present disclosure. Furthermore, among the structural components in the following embodiments, components not recited in the independent claims which indicate the broadest concept of the present disclosure are described as arbitrary structural components.

In addition, each of the diagrams is a schematic diagram and thus is not necessarily strictly illustrated. Therefore, the scale sizes and the like are not necessarily exactly represented in each of the diagrams. In each of the diagrams, substantially the same structural components are assigned with the same reference signs, and redundant descriptions will be omitted or simplified.

Moreover, in this Specification, the terms "above" and "below" do not refer to the upward (vertically upward) direction and downward (vertically downward) direction in terms of absolute spatial recognition, and are used as terms defined by relative positional relationships based on the stacking order of a stacked structure. Furthermore, the terms "above" and "below" are applied not only when two structural components are disposed with a gap therebetween and another structural component is interposed between the two structural components, but also when two structural components are disposed in contact with each other.

Embodiment 1

A semiconductor laser element according to Embodiment 1 will be described.

[1-1. Overall Structure]

Firstly, the overall structure of a semiconductor laser element according to the present embodiment will be described with reference to FIG. 1 through FIG. 4.

Figure 1:
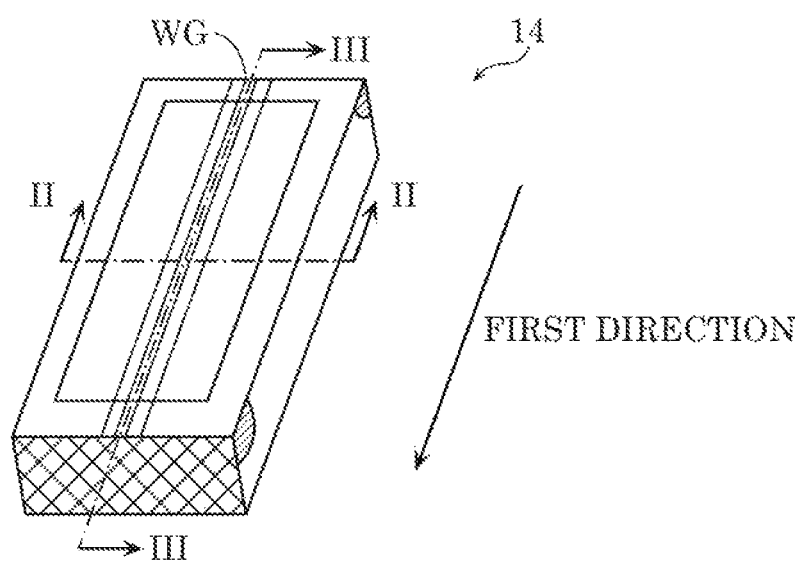
FIG. 1 is a perspective view schematically illustrating the exterior of a semiconductor laser element according to Embodiment 1.
Figure 2:
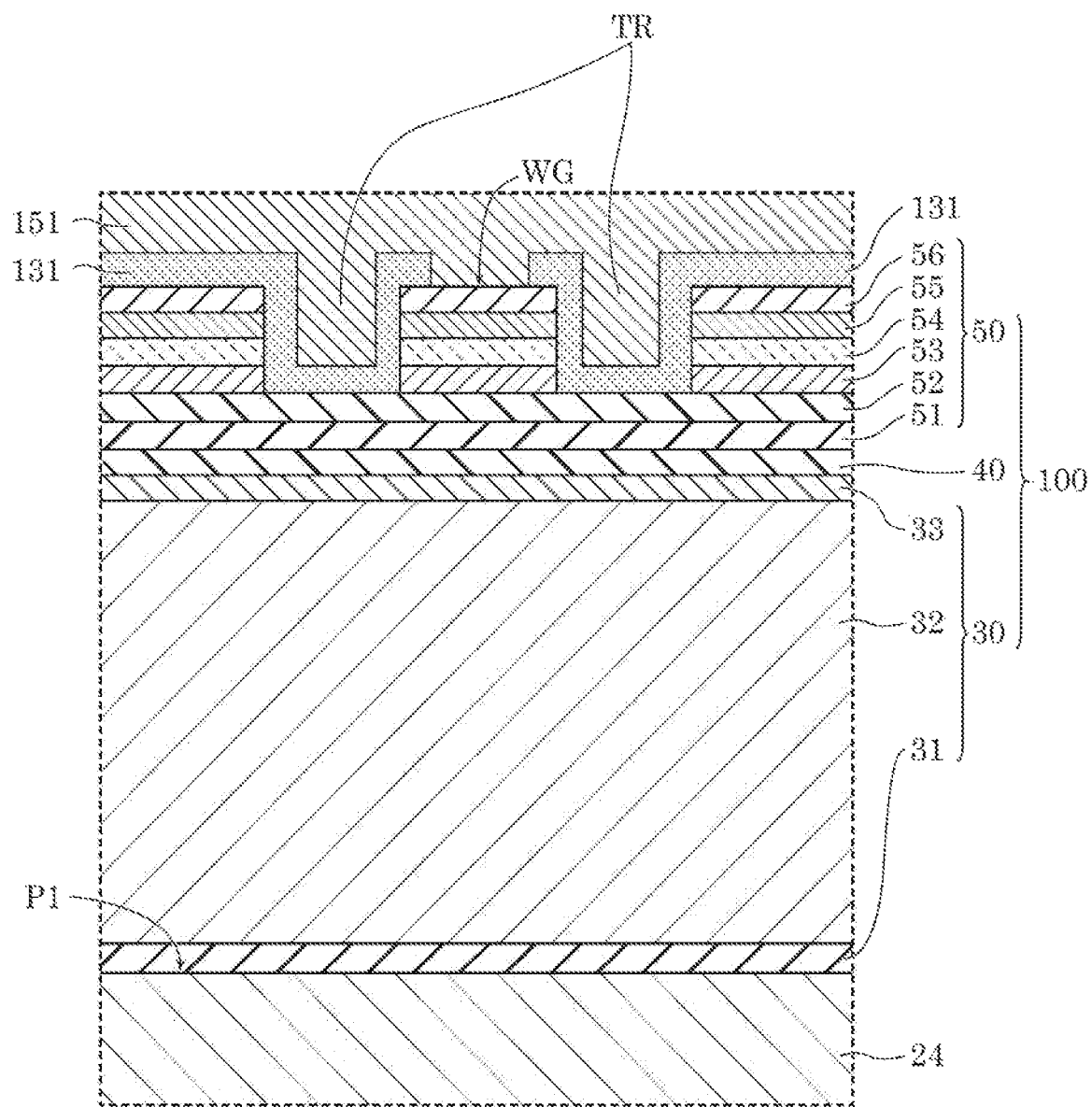
FIG. 2 is a first sectional view schematically illustrating the structure of the semiconductor laser element according to Embodiment 1.
Figure 3:
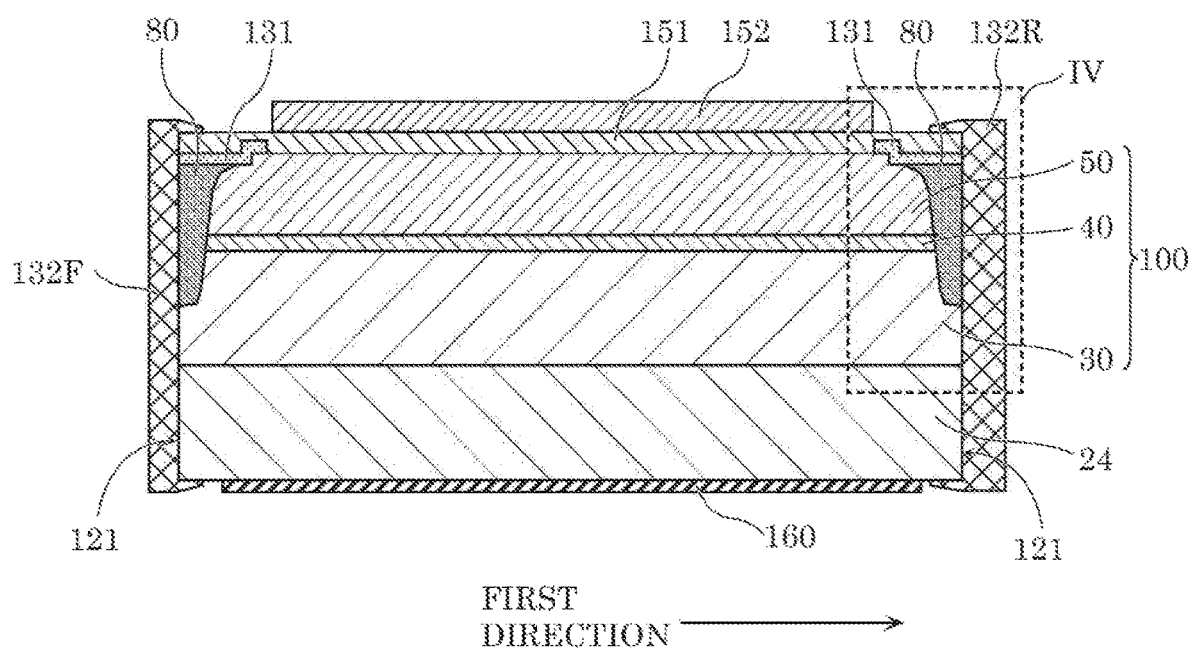
FIG. 3 is a second sectional view schematically illustrating the structure of the semiconductor laser element according to Embodiment 1.
Figure 4:
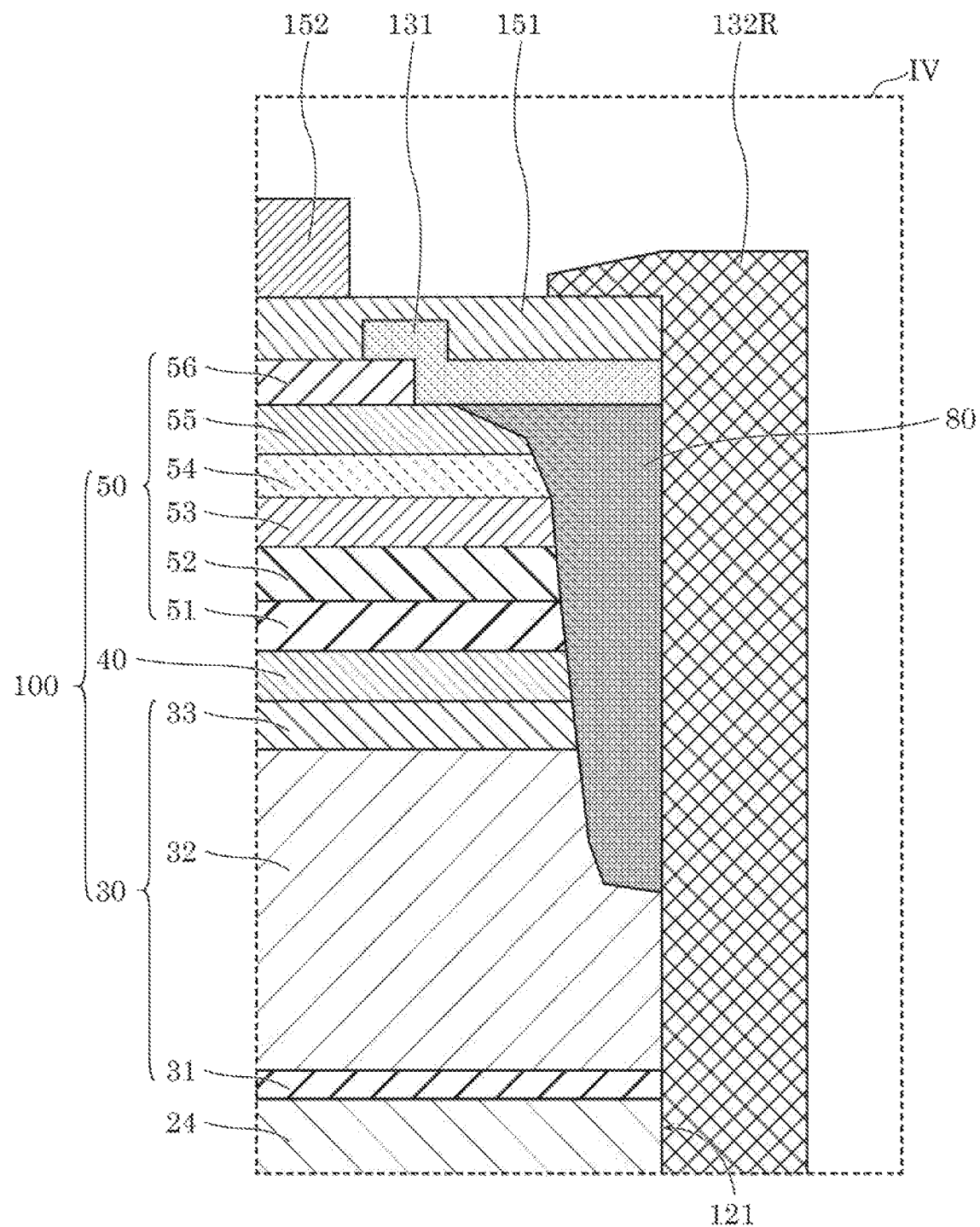
FIG. 4 is a partially enlarged view of FIG. 3.

FIG. 1 is a perspective view schematically illustrating the exterior of semiconductor laser element 14 according to the present embodiment. FIG. 2 is the first sectional view schematically illustrating the structure of semiconductor laser element 14 according to the present embodiment. FIG. 2 shows an enlarged sectional view of the vicinity of the waveguide WG taken along II-II of FIG. 1. FIG. 3 is the second sectional view schematically illustrating the structure of semiconductor laser element 14 according to the present embodiment. FIG. 3 shows the sectional view taken along III-III of FIG. 1. FIG. 4 is a partially enlarged view of FIG. 3. FIG. 4 shows an enlarged view of the IV part surrounded by the dotted line in FIG. 3.

As shown in FIG. 2, semiconductor laser element 14 includes chip-like substrate 24 and semiconductor layer 100 disposed on first surface P1 of chip-like substrate 24.

Chip-like substrate 24 is a substrate on which semiconductor layer 100 of semiconductor laser element 14 is stacked. In the present embodiment, chip-like substrate 24 is an n-type semiconductor substrate containing GaAs, particularly, an n-GaAs substrate in which the plane direction is inclined by 10 degrees from the (100) plane toward the (011) plane. The plane direction of first surface P1 is the 10-degree off-angled (100) plane which is inclined by 10 degrees toward the (011) plane.

Semiconductor layer 100 includes: first semiconductor layer 30 including an n-type layer; active layer 40; and second semiconductor layer 50 including a p-type layer, which are stacked on chip-like substrate 24 in this order. In the present embodiment, semiconductor layer 100 mainly includes: n-type cladding layer 32 disposed above chip-like substrate 24; active layer 40 disposed above n-type cladding layer 32; and a p-type cladding layer disposed above active layer 40.

As shown in FIG. 3, semiconductor laser element 14 includes: p-side lower electrode 151 and p-side upper electrode 152 which are disposed on semiconductor layer 100; and n-side electrode 160 disposed on a surface of chip-like substrate 24 opposite to semiconductor layer 100.

Semiconductor layer 100 of semiconductor laser element 14 also includes waveguide WG formed in a direction along semiconductor layer 100. In the present embodiment, in semiconductor layer 100, waveguide WG having a ridge structure is formed. As shown in FIG. 1, waveguide WG extends in the first direction.

Moreover, as shown in FIG. 3, both end faces of semiconductor laser element 14 in the first direction are each cleavage end face 121. Two cleavage end faces 121 serve as resonator faces of semiconductor laser element 14, and second protective films 132F and 132R each serving as a reflectance control film are formed. Second protective films 132F and 132R not only serve as reflectance control films on a front side (i.e., an end-face side from which laser light is mainly emitted) and a rear side of the resonator, respectively, but also have a function for protecting cleavage end faces 121.

Moreover, as shown in FIG. 3 and FIG. 4, semiconductor layer 100 has window regions 80 formed at both ends of waveguide WG. In the present embodiment, window region 80 in which light absorption in active layer 40 is reduced is formed in the vicinity of each of two cleavage end faces 121 serving as resonator faces.

Moreover, in the present embodiment, the resonator length is 280 μm. Here, the resonator length of semiconductor laser element 14 is set to 300 μm or less, and thus a ratio of a region other than window region 80 to waveguide WG can be reduced, thereby reducing saturation light output power. Accordingly, it is possible to prevent end-face damage of semiconductor laser element 14.

The following describes each of the components in semiconductor laser element 14.

Chip-like substrate 24 is a substrate obtained by dividing into chip forms, and semiconductor layer 100 is stacked thereon. The structure of chip-like substrate 24 is not particularly limited as long as it is an n-type semiconductor substrate. In the present embodiment, as described above, chip-like substrate 24 is the n-GaAs substrate.

First semiconductor layer 30 is a semiconductor layer including an n-type layer. In the present embodiment, as shown in FIG. 2, first semiconductor layer 30 includes n-type buffer layer 31, n-type cladding layer 32, and n-side light guide layer 33. N-type buffer layer 31 is an n-GaAs layer having a film thickness of 0.4 μm. N-type cladding layer 32 contains $Al_{x1}Ga_{1-x1-y1}In_{y1}As_{1-z1}P_{z1}$. In the present embodiment, n-type cladding layer 32 is an n-$(Al_{0.16}Ga_{0.84})_{0.5}In_{0.5}P$ layer having a film thickness of 4.7 μm. N-side light guide layer 33 is a $Ga_{0.5}In_{0.5}P$ layer having a film thickness of 0.09 μm.

Active layer 40 is a layer serving as a light emitting unit of semiconductor laser element 14. Active layer 40 has a well layer and a barrier layer. The barrier layer contains $Al_{x2}Ga_{1-x2-y2}In_{y2}As_{1-z2}P_{z2}$.

In the present embodiment, active layer 40 is an active layer of a multiple quantum well including: a barrier layer containing $Al_{0.59}Ga_{0.41}As$ and having a film thickness of 0.03 μm; a well layer containing GaAs and having a film thickness of 0.0065 μm; a barrier layer containing $Al_{0.59}Ga_{0.41}As$ and having a film thickness of 0.004 μm; a well layer containing GaAs and having a film thickness of 0.0065 μm; and a barrier layer containing $Al_{0.59}Ga_{0.41}As$ and having a film thickness of 0.021 μm, from a side facing to n-side light guide layer 33.

Second semiconductor layer 50 is a semiconductor layer including a p-type layer. In the present embodiment, as shown in FIG. 2, second semiconductor layer 50 includes p-side light guide layer 51, p-type first cladding layer 52, p-type second cladding layer 53, p-type third cladding layer 54, p-type interlayer 55, and p-type contact layer 56.

P-side light guide layer 51 is a $Ga_{0.5}In_{0.5}P$ layer having a film thickness of 0.07 μm.

P-type first cladding layer 52 is a p-$(Al_{0.30}Ga_{0.70})_{0.5}In_{0.5}P$ layer having a film thickness of 0.17 μm. P-type second cladding layer 53 is a p-$(Al_{0.60}Ga_{0.40})_{0.5}In_{0.5}P$ layer having a film thickness of 0.4 μm. P-type third cladding layer 54 is a p-$(Al_{0.30}Ga_{0.70})_{0.5}In_{0.5}P$ layer having a film thickness of 0.6 μm. It is to be noted that p-type first cladding layer 52, p-type second cladding layer 53, and p-type third cladding layer 54 are each an example of the p-type cladding layer according to the present embodiment.

P-type interlayer 55 is a p-$(Al_{0.1}Ga_{0.9})_{0.5}In_{0.5}P$ layer having a film thickness of 0.106 μm. The Al composition ratio of p-type interlayer 55 is lower than that of p-type third cladding layer 54. P-type contact layer 56 is a p-GaAs layer having a film thickness of 0.23 μm.

It is to be noted that the cladding layer including the above-mentioned n-type cladding layer 32 and p-type cladding layer refers to a layer having a function of confining light in the stacking direction of semiconductor layer 100, and further having a film thickness of 0.1 μm or more and a refractive index lower than an effective refractive index for light confined in the stacking direction.

As shown in FIG. 2, first protective film 131 is formed on: the sides and a part of the top of the ridge serving as waveguide WG; trenches TRs; and flat portions at both sides. In the top of the ridge, first protective film 131 has an opening which exposes the top of the ridge. As shown in FIG. 4, the vicinity of cleavage end face 121 including window region 80 is covered with first protective film 131. First protective film 131 is not particularly limited as long as it is a dielectric film, and $SiO_2$, SiN, $TiO_2$, $ZrO_2$, $Al_2O_3$, $Nb_2O_5$, $Ta_2O_5$, etc. may be used. In the present embodiment, first protective film 131 is a SiN film having a film thickness of approximately 180 nm.

P-side lower electrode 151 shown in FIG. 2 through FIG. 4 is a patterned metal film. In the present embodiment, p-side lower electrode 151 includes: a Ti film having a film thickness of approximately 50 nm; a Pt film having a film thickness of approximately 150 nm; and an Au film having a film thickness of approximately 50 nm, which are stacked on semiconductor layer 100 in this order. P-side lower electrode 151 is in contact with p-type contact layer 56 in the opening of first protective film 131.

P-side upper electrode 152 shown in FIG. 3 is an Au film having a film thickness of at least 2.0 μm and at most 5.0 μm.

In the present embodiment, n-side electrode 160 shown in FIG. 3 includes: an AuGe film having a film thickness of 90 nm; a Ni film having a film thickness of 20 nm; an Au film having a film thickness of 50 nm; a Ti film having a film thickness of 100 nm; a Pt film having a film thickness of 50 nm; a Ti film having a film thickness of 50 nm; a Pt film having a film thickness of 100 nm; and an Au film having a film thickness of 500 nm, which are stacked on chip-like substrate 24 in this order.

In the present embodiment, second protective film 132F employed on the front side is a dielectric multilayer film in which one or multiple pairs of an $Al_2O_3$ film having a film thickness of 50 nm and a $Ta_2O_5$ film having a film thickness of 55 nm are stacked on cleavage end face 121. Moreover, second protective film 132R employed on the rear side is a dielectric multilayer film in which an $Al_2O_3$ film having a film thickness of $\lambda/8n_A$, a $SiO_2$ film having a film thickness of $\lambda/8n_S$, and a $Ta_2O_5$ film having a film thickness of $\lambda/4n_T$ are stacked on cleavage end face 121 in this order, and one or multiple pairs of a $SiO_2$ film having a film thickness of $\lambda/4n_S$ and a $Ta_2O_5$ film having a film thickness of $\lambda/4n_T$ are further stacked. It is to be noted that λ is the oscillation wavelength of semiconductor laser element 14, and $n_A$, $n_T$, and $n_S$ are the refractive indexes of the $Al_2O_3$ film, the $Ta_2O_5$ film, and the $SiO_2$ film for light having wavelength λ, respectively. In the present embodiment, λ is approximately 860 nm, and an $Al_2O_3$ film having a film thickness of 65 nm, a $SiO_2$ film having a film thickness of 74 nm, and a $Ta_2O_5$ film having a film thickness of 102 nm are stacked on cleavage end face 121 in this order, and multiple pairs of a $SiO_2$ film having a film thickness of 147 nm and a $Ta_2O_5$ film having a film thickness of 102 nm are further stacked.

Window region 80 is formed by diffusion of impurity such as Zn for forming a window region. Window region 80 is a region in which the quantum well structure of active layer 40 is changed into a disordered structure by diffusing the impurity in the vicinity of the resonator faces of semiconductor laser element 14, and thereby the energy hand gap of active layer 40 is increased. By increasing the energy band gap, it is possible to form window region 80 in which absorption of laser oscillation light is reduced. With this, damage by melting at the end face of semiconductor laser element 14 can be reduced, and thus it is possible to achieve highly reliable semiconductor laser element 14.

[1-2. Method of Manufacturing Semiconductor Laser Element]

Next, a method of manufacturing the semiconductor laser element according to the present embodiment will be described. In the present embodiment, each of the steps in the method of manufacturing the semiconductor laser element described above as an example of the semiconductor laser element will be described.

[1-2-1. Step of Forming Semiconductor Layer]

Figure 5:
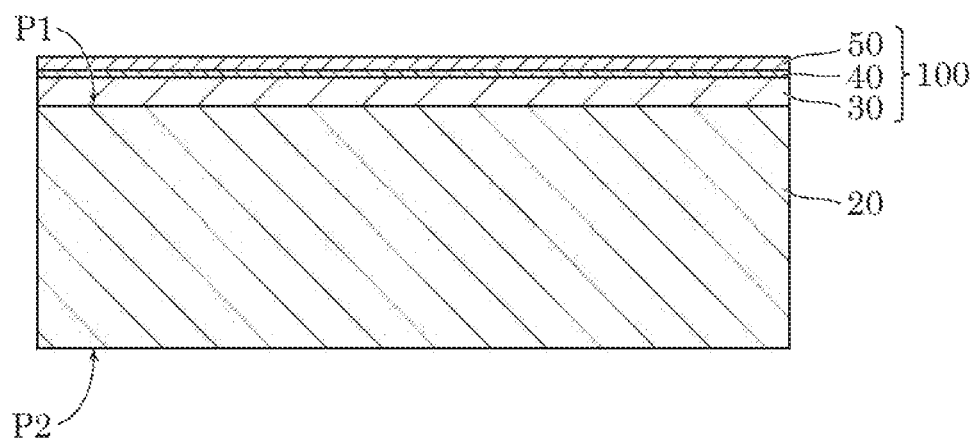
FIG. 5 is a schematic sectional view of a substrate, illustrating the outline of a step of forming a semiconductor layer of the semiconductor laser element according to Embodiment 1.

A step of forming the semiconductor layer according to the present embodiment; will be described with reference to the drawings. FIG. 5 is a schematic sectional view of substrate 20, illustrating the outline of the step of forming the semiconductor layer of the semiconductor laser element according to the present embodiment.

Firstly, as shown in FIG. 5, substrate 20 having first surface P1 and second surface P2 is prepared, and semiconductor layer 100 including active layer 40 is formed on first surface P1 of substrate 20. Each layer included in semiconductor layer 100 is stacked using, for example, metalorganic chemical vapor deposition (MOCVD). In the present embodiment, first semiconductor layer 30 including an n-type layer, active layer 40, and second semiconductor layer 50 including a p-type layer are formed on substrate 20 in this order as semiconductor layer 100.

Figure 6A:
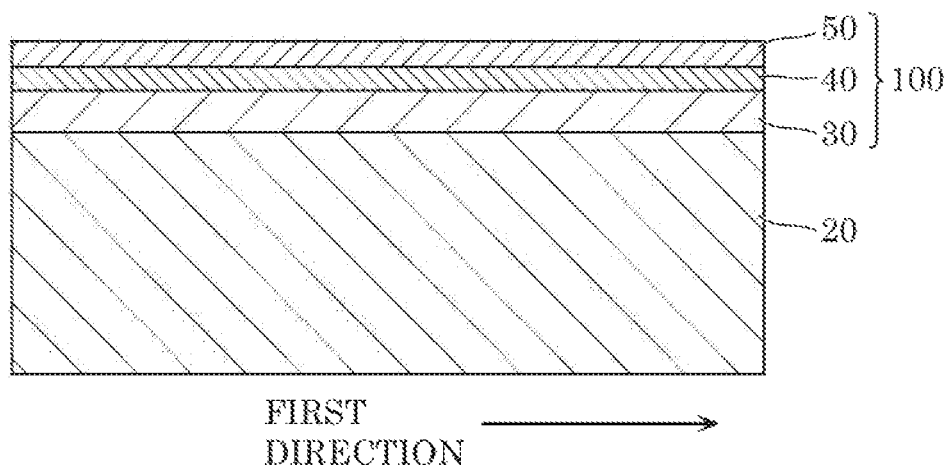
FIG. 6A is a schematic sectional view of a substrate and a semiconductor layer according to Embodiment 1.
Figure 6B:
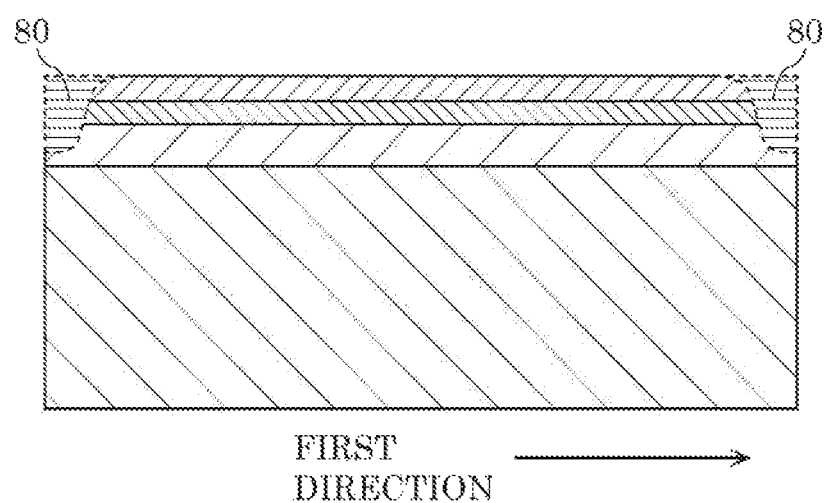
FIG. 6B is a schematic sectional view of the substrate and the semiconductor layer, illustrating a method of forming a window region according to Embodiment 1.

Subsequently, in the present embodiment, a so-called window region is formed in the vicinity of the resonator face of the semiconductor laser element. The following describes a method of forming the window region with reference to FIG. 6A and FIG. 6B. FIG. 6A is a schematic sectional view of substrate 20 and semiconductor layer 100 according to the present embodiment. FIG. 6B is a schematic sectional view of substrate 20 and semiconductor layer 100, illustrating the method of forming window region 80 according to the present embodiment. FIG. 6A and FIG. 6B each show the sectional view of substrate 20 and semiconductor layer 100 along the first direction.

For example, as shown in FIG. 6B, window region 80 may be formed by thermally diffusing Zn into the p-type contact layer included in second semiconductor layer 50. More specifically, a ZnO film serving as a diffusion source and a SiN or SiO film for preventing vaporization of Zn are formed above the p-type contact layer in this order, and Zn is diffused into the vicinity of the resonator face of the semiconductor laser element through a thermal treatment. Thus, the energy band gap of active layer 40 is increased. With this, it is possible to form window region 80 in which light absorption in active layer 40 is reduced. Such window region 80 can prevent the deterioration in the vicinity of the resonator face of semiconductor laser element 14.

[1-2-2. Step of Forming Waveguide]

Figure 7:
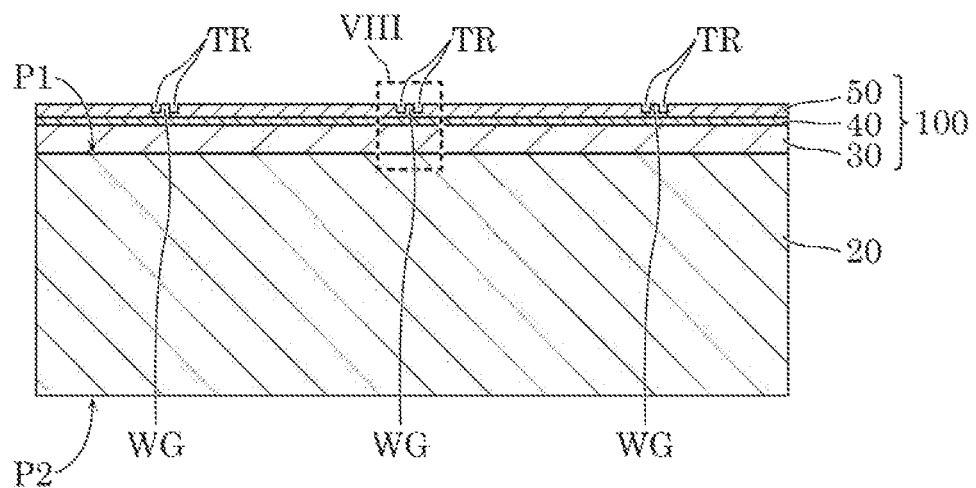
FIG. 7 is a schematic sectional view of the substrate, illustrating the outline of a step of forming a waveguide according to Embodiment 1.

Next, a step of forming a waveguide will be described with reference to the drawings. FIG. 7 is a schematic sectional view of substrate 20, illustrating the outline of the step of forming the waveguide according to the present embodiment.

As shown in FIG. 7, waveguides WGs each of which uses a ridge between a pair of trenches TRs are formed by forming multiple pairs of trenches TRs in second semiconductor layer 50 formed above substrate 20, in a direction perpendicular to the paper of FIG. 7. In this manner, multiple waveguides WGs extending in the first direction are formed in semiconductor layer 100. The width of each waveguide WG is approximately 3 µm, for example.

The method of forming waveguide WG is not particularly limited. In the present embodiment, in order to form the ridge, a photolithographic technique is used to form a mask using $SiO_2$ or the like. Subsequently, the pair of trenches TRs, i.e., the ridge, is formed by non-selective etching such as dry etching. In doing so, the dry etching is performed on the p-type contact layer, the p-type interlayer, the p-type third cladding layer, and the p-type second cladding layer, and the p-type second cladding layer is removed not completely but to the middle.

Next, a protective film made of $SiO_2$ or the like is formed on the entire top surface of semiconductor layer 100 in which the ridge is formed.

Next, $SiO_2$ protective film is removed by dry etching only at the bottom of trench TR. In doing so, the side wall of the ridge and the top of the ridge are covered by the protective film.

Subsequently, the p-type second cladding layer is removed completely by selective etching such as wet etching. In this manner, the p-type first cladding layer is exposed at the bottom of trench TR. As described above, waveguide WG can be formed in semiconductor layer 100.

Here, the dry etching technique employed in the present embodiment may be anisotropic plasma etching. A method using, for example, inductively coupled plasma (hereinafter referred to as ICP) or electron cyclotron resonance (hereinafter referred to as ECR) plasma is taken as an example of the dry etching.

Moreover, gas mixture of $SiCl_4$ and Ar, or the like is used as etching gas, but chlorine gas, boron trichloride gas, or the like may be used instead of $SiCl_4$.

In the present embodiment, the ICP method is employed as the dry etching technique, and the gas mixture of $SiCl_4$ and Ar is used as the etching gas. Etching conditions are as follows: the volume ratio of $SiCl_4$ to the gas mixture is at least 5% and at most 12%; the temperature of the lower electrode on which the semiconductor substrate is provided is at least 150 degrees C. and at most 200 degrees C.; the pressure in chamber is at least 0.1 Pa and at most 1 Pa; the bias power of the lower electrode is at least 50 W and at most 150 W; and the ICP power is at least 200 W and at most 300 W. However, the etching conditions are not limited to these, and may be selected as needed.

[1-2-3. Step of Forming First Protective Film]

Next, the step of forming a first protective film will be described with reference to FIG. 8.

Figure 8:
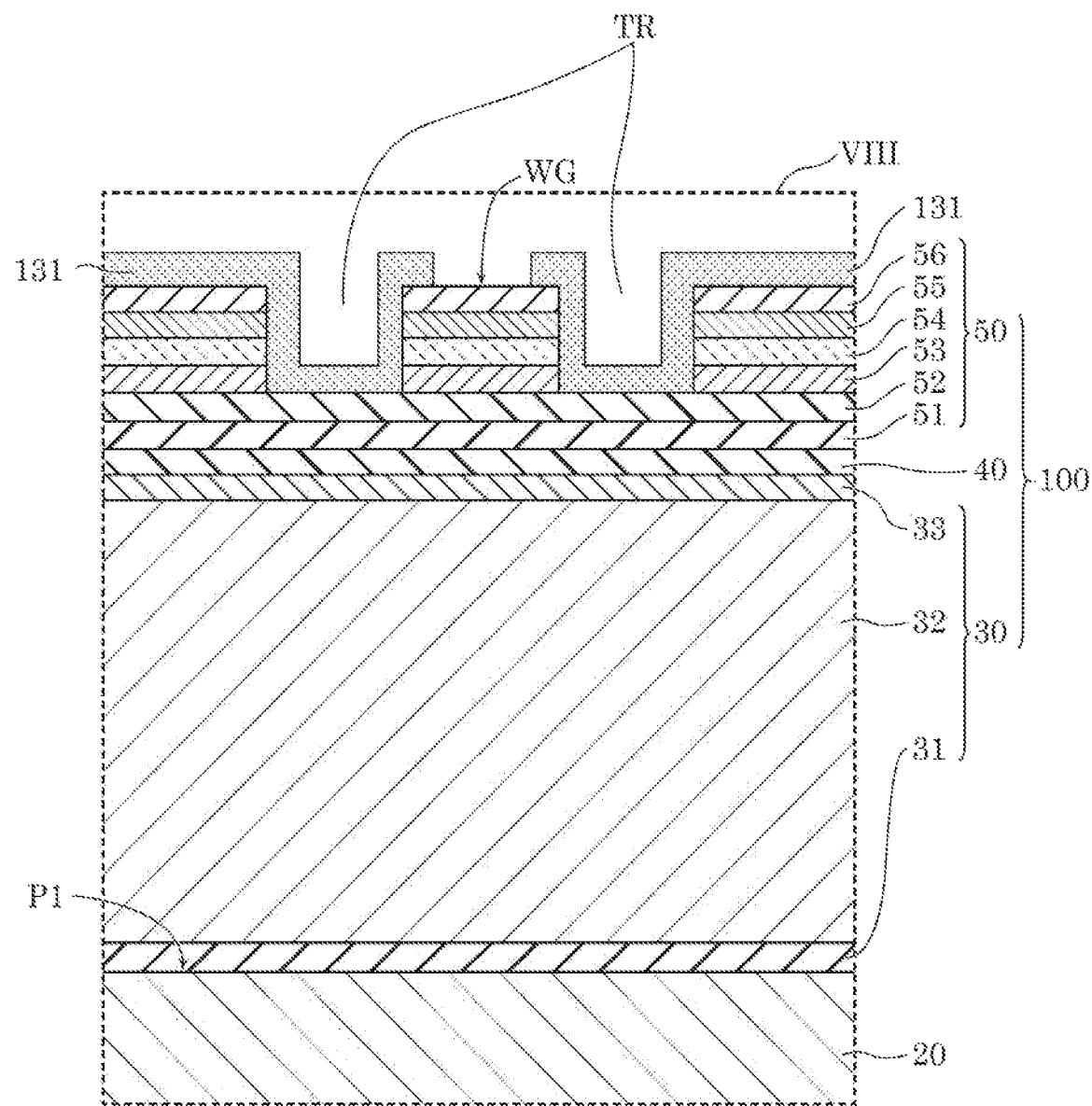
FIG. 8 is a schematic sectional view of the substrate, illustrating the outline of a step of forming a first protective film according to Embodiment 1.

FIG. 8 is a schematic sectional view of substrate 20, illustrating the outline of the step of forming the first protective film according to the present embodiment. FIG. 8 is the enlarged view of the region within dotted box VIII shown in FIG. 7, illustrating the step of forming the first protective film. As shown in FIG. 8, first protective film 131 is formed on semiconductor layer 100 excluding a part of the top of the ridge. The part of the top of the ridge in which first protective film 131 is not formed is a region in contact with the p-type lower electrode to be formed later.

The method of forming first protective film 131 is not particularly limited. In the present embodiment, first protective film 131 made of SiN and having a film thickness of approximately 180 nm is formed on the sides and a part of the top of the ridge, trenches TRs, and flat portions at both sides,

[1-2-4. Step of Forming Electrode]

Next, the step of forming an electrode will be described. The electrode formed in this step is a p-type electrode, an n-type electrode, or the like for supplying electric power to the semiconductor laser element manufactured using the manufacturing method according to the present embodiment.

P-side lower electrode 151 is formed above semiconductor layer 100 including the top of the ridge and trenches TRs. P-side upper electrode 152 is further formed on p-side lower electrode 151. P-side lower electrode 151 is in contact with second semiconductor layer 50 in the opening of first protective film 131 provided on the ridge.

The structures of p-side lower electrode 151 and p-side upper electrode 152 and the forming method thereof are not particularly limited. In the present embodiment, a mask is formed by photolithography using a resist, and a Ti film, a Pt film, and an Au film are formed in this order using the vapor deposition method after a pre-process of wet etching.

Next, a pattern for p-side upper electrode 152 is formed by photolithography using a resist mask, and an Au film having a film thickness of at least 2.0 μm and at most 5.0 μm is formed by an electrolytic plating method. Next, the resist is removed using a lift-off method to form patterned p-side upper electrode 152.

Next, substrate 20 is ground until a thickness from second surface P2 of substrate 20 to p-side upper electrode 152 becomes approximately 100 μm (this grinding step is not shown). Subsequently, a resist mask is formed on second surface P2 using photolithography, and an AuGe film, a Ni film, an Au film, a Ti film, a Pt film, a Ti film, a Pt film, and an Au film are formed in this order using the vapor deposition method after a pre-process of wet etching. Subsequently, the resist is removed using the lift-off method to form patterned n-side electrode 160.

With these steps, substrate 20 on which semiconductor layer 100 is stacked is formed.

[1-2-5. Step of Cleaving Substrate]

Next, the step of cleaving the substrate will be described with reference to the drawings. At this step, substrate 20 on which semiconductor layer 100 formed as described above is stacked is cleaved at a face corresponding to the resonator face of the semiconductor laser element. In other words, as shown in FIG. 3, substrate 20 is cleaved such that window region 80 is located at the resonator face. In the present embodiment, substrate 20 is cleaved such that the resonator length of semiconductor laser element 14 is 300 μm or less. With this, it is possible to form a bar-like substrate on which semiconductor layer 100 is formed.

[1-2-6. Step of Forming Second Protective Film]

Next, the step of forming a second protective film will be described. At this step, the second protective film is formed on cleavage end face 121 formed at the above-mentioned step of cleaving the substrate, using an ECR chemical vapor deposition method or the like. It is to be noted that the structures of second protective films 132F and 132R and the forming method thereof are not particularly limited.

The light reflectance of front-side second protective film 132F is approximately 30%, and the light reflectance of rear-side second protective film 132R is 90% or more. Semiconductor laser element 14 according to the present embodiment can be formed by further dividing the bar-like substrate formed as described above into chip-like substrates.

[1-3. Function and Advantageous Effect of Semiconductor Laser Element]

Next, the function and advantageous effect of semiconductor laser element 14 according to the present embodiment will be described.

Figure 9:
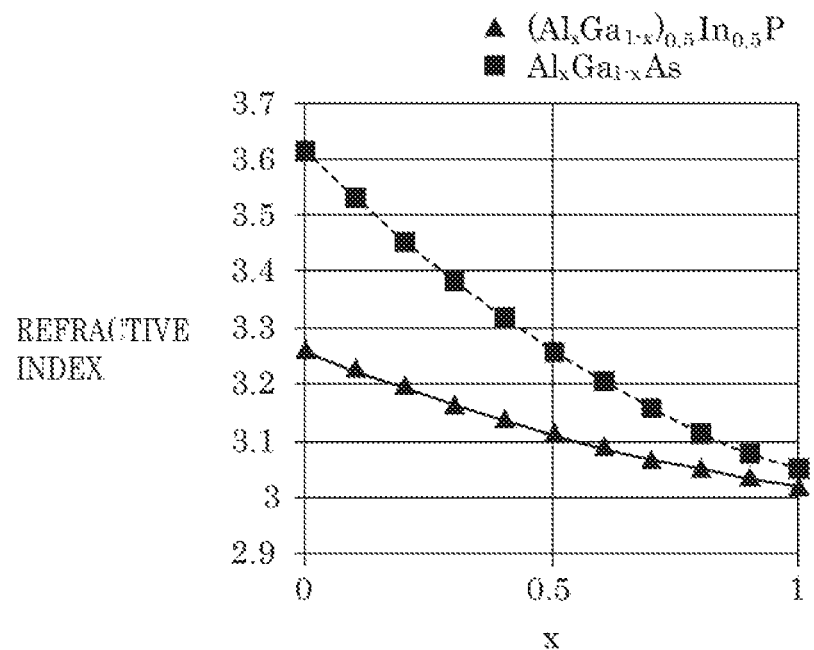
FIG. 9 is a graph illustrating the relationship between refractive index and Al con position ratio with respect to an AlGaInP-based semiconductor and an AlGaAs-based semiconductor.
Figure 10:
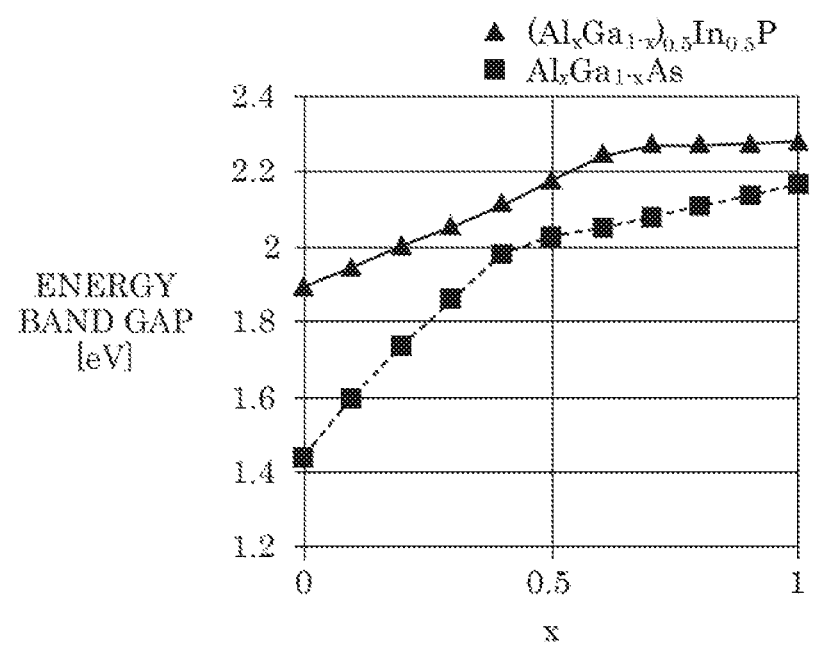
FIG. 10 is a graph illustrating the relationship between energy land gap and Al composition ratio with respect to an AlGaInP-based semiconductor and an AlGaAs-based semiconductor.

The refractive indexes and the energy band gaps of an AlGaInP-based semiconductor and an AlGaAs-based semiconductor will be described with reference to FIG. 9 and FIG. 10. FIG. 9 is a graph illustrating the relationship between refractive index and Al composition ratio x with respect to an $(Al_xGa_{1-x})_{0.5}In_{0.5}P$-based semiconductor and an $Al_xGa_{1-x}As$-based semiconductor. FIG. 10 is a graph illustrating the relationship between energy band gap and Al composition ratio x with respect to the $(Al_xGa_{1-x})_{0.5}In_{0.5}P$-based semiconductor and the $Al_xGa_{1-x}As$-based semiconductor. As shown in FIG. 9 and FIG. 10, in both the AlGaInP-based semiconductor and the AlGaAs-based semiconductor, it is found that the energy band gap decreases as the refractive index increases. Accordingly, in the case where both the cladding layer and the barrier layer are formed using an AlGaInP-based material, or the case where both the cladding layer and the barrier layer are formed using an AlGaAs-based material, the barrier layer has a refractive index lower than that of the cladding layer in the both cases when the barrier layer has an energy band gap larger than that of the cladding layer. On the other hand, it is found that the barrier layer may have an energy band gap larger than that of the cladding layer and a refractive index higher than that of the n-type cladding layer by forming the barrier layer and the cladding layer using $Al_{x2}Ga_{1-x2}As$ and $(Al_xGa_{1-x})_{0.5}In_{0.5}P$, respectively.

Figure 11:
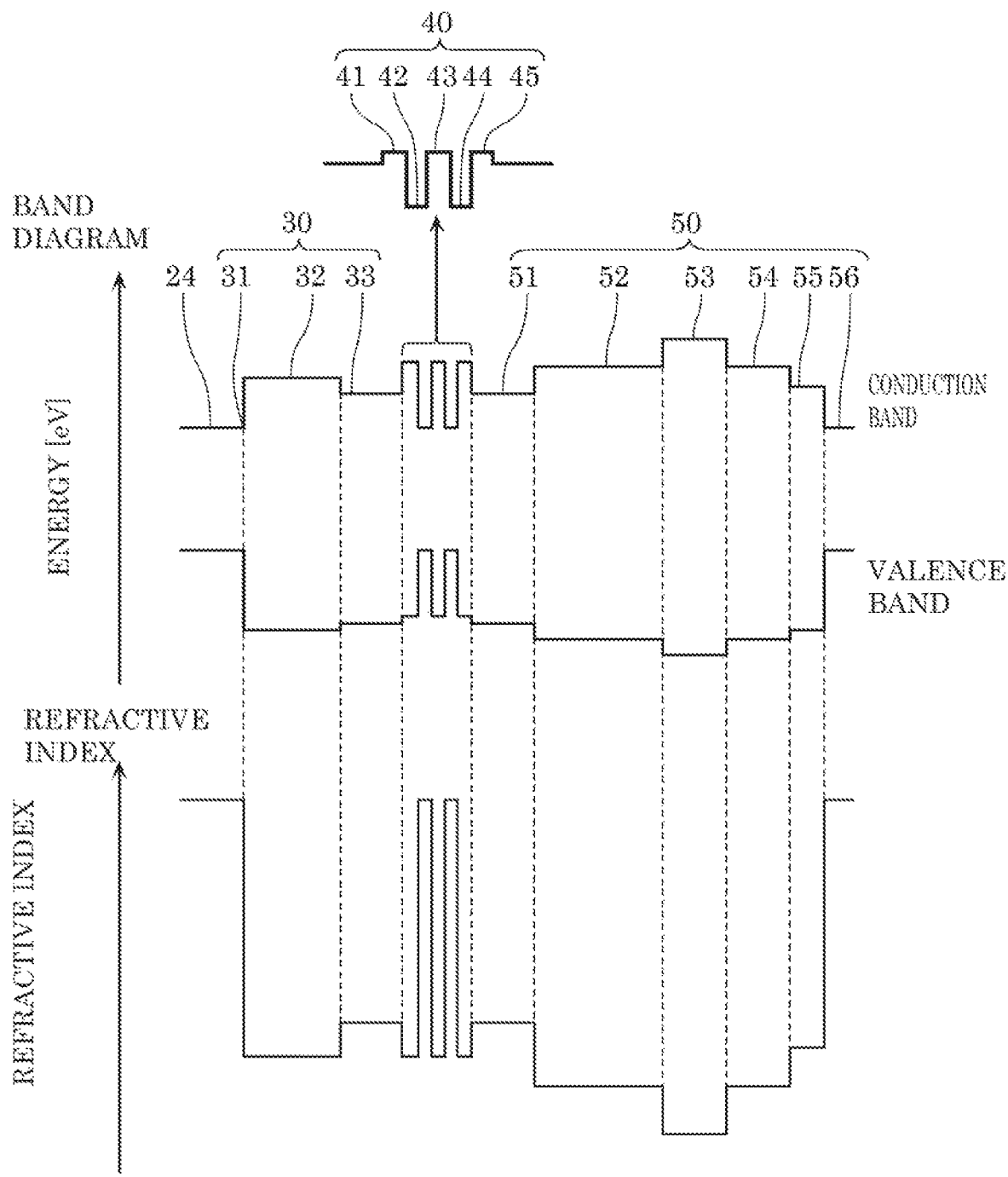
FIG. 11 is a diagram illustrating the energy band structure (band diagram) and the refractive index distribution of the semiconductor laser element according to Embodiment 1.

The semiconductor laser element according to the present embodiment includes an AlGaInP-based semiconductor layer and an AlGaAs-based semiconductor layer. The energy band structure and the refractive index distribution of semiconductor laser element 14 according to the present embodiment will be described with reference to FIG. 11. FIG. 11 is a diagram illustrating the energy band structure (band diagrams and the refractive index distribution of semiconductor laser element 14 according to the present embodiment.

The structure of semiconductor laser element 14 according to the present embodiment allows barrier layers 41, 43, and 45 to have an energy band gap larger than that of n-type cladding layer 32 and a refractive index higher than that of n-type cladding layer 32. In doing so, n-type cladding layer 32 contains $Al_{x1}Ga_{1-x1-y1}In_{y1}As_{1-z1}P_{z1}$, barrier layers 41, 43, and 45 contain $Al_{x2}Ga_{1-x2-y2}In_{y2}As_{1-z2}P_{z2}$, and $z1>z2$ is satisfied. Furthermore, $z1=1$, and $z2=0$ may be satisfied, or $z1=1$, $z2=0$, and $x1<x2$ may be satisfied.

According to the layer structure of semiconductor laser element 14 according to the present embodiment, the energy band gap of each of barrier layers 41, 43 and 45 containing AlGaAs (2.042 eV) is larger than that of n-type cladding layer 32 (1.970 eV). Moreover, the conduction band position of n-type cladding layer 32 is lower than that of each of barrier layers 41, 43 and 45. Accordingly, the energy of the conduction band of semiconductor laser element 14 is the highest at barrier layers 41, 43 and 45, and is lower at n-type cladding layer 32 and chip-like substrate 24 in this order. With this band structure, it is possible to allow electrons injected from chip-like substrate 24 to arrive at active layer 40 at the minimum voltage. Accordingly, semiconductor laser element 14 according to the present embodiment can reduce the operating voltage. Moreover, as shown in FIG. 11, the refractive index of each of barrier layers 41, 43 and 45 (3.211) is higher than that of n-type cladding layer 32 (3.208). With this, the light generated in well layers 42 and 44 can be efficiently confined in active layer 40, and thus it is possible to enhance the efficiency of light emission.

Moreover, in the present embodiment, chip-like substrate 24 contains GaAs. Accordingly, the energy band gap of n-type cladding layer 32 containing $Al_{x1}Ga_{1-x1-y1}In_{y1}As_{1-z1}P_{z1}$ is larger than that of chip-like substrate 24. With this, the energy of the conduction band of chip-like substrate 24 can be reduced, and thus it is possible to prevent a hetero barrier between chip-like substrate 24 and n-type cladding layer 32. Accordingly, it is possible to more reliably reduce the operating voltage of semiconductor laser element 14.

Moreover, in the present embodiment, the energy band gap of the p-type cladding layer (p-type first cladding layer 52, p-type second cladding layer 53, and p-type third cladding layer 54) is larger than that of the barrier layer. With this, electron leakage from active layer 40 to p-type cladding layer can be reduced, and thus it is possible to enhance the effect of confining electrons in active layer 40. Accordingly, semiconductor laser element 14 according to the present embodiment can achieve high efficiency of light emission even under high-temperature operation.

Moreover, semiconductor laser element 14 according to the present embodiment includes n-side light guide layer 33 that is disposed between n-type cladding layer 32 and active layer 40 and has a refractive index higher than that of n-type cladding layer 32. With this, it is possible to enhance the effect of confining light in active layer 40.

In addition, n-side light, guide layer 33 may be made of $Al_{x3}Ga_{1-x3-y3}In_{y3}P$ (0≤x3). Furthermore, when n-type cladding layer 32 is made of $Al_{x1}Ga_{1-x1-y1}In_{y1}P$, x3<x1 is satisfied. In comparison with the n-type light guide layer made of an AlGaAs-based material, Al composition ratio x3 can be reduced when n-side light guide layer 33 is made of $Al_{x3}Ga_{1-x3-y3}In_{y3}P$. With this, it is possible to reduce a nonradiative recombination center caused by the oxidized Al in n-side light guide layer 33 at cleavage end face 121, and thus end-face deterioration due to the increase in the nonradiative recombination center can be prevented. Accordingly, it is possible to achieve highly reliable semiconductor laser element 14. Moreover, when window region 80 is formed by diffusing impurities for window region formation such as Zn, an AlGaInP-based material can be used for n-side light guide layer 33 to enhance the Zn diffusion. With this, it is possible to form window region 80 using small amounts of impurities for window region formation, and thus the free carrier loss due to impurities can be reduced. Accordingly, it is possible to achieve high efficiency of light emission. Furthermore, p-side light guide layer 51 may be made of $Al_{x4}Ga_{1-x4-y4}In_{y4}P$ (0≤x4). With this, it is possible to prevent Al in p-side light guide layer 51 at cleavage end face 121 from being oxidized.

As described above, semiconductor laser element 14 according to the present embodiment can achieve both low operating voltage and high light confinement effect.

[1-4. Variation 1]

Next, a semiconductor laser element according to Variation 1 of Embodiment 1 will be described. The semiconductor laser element according to the present variation differs from semiconductor laser element 14 according to Embodiment 1 in that a hole barrier layer and an electron barrier layer are provided, and the rest is the same. The following describes the semiconductor laser element according to the present variation with reference to FIG. 12, mainly in terms of differences from semiconductor laser element 14 according to Embodiment 1.

Figure 12:
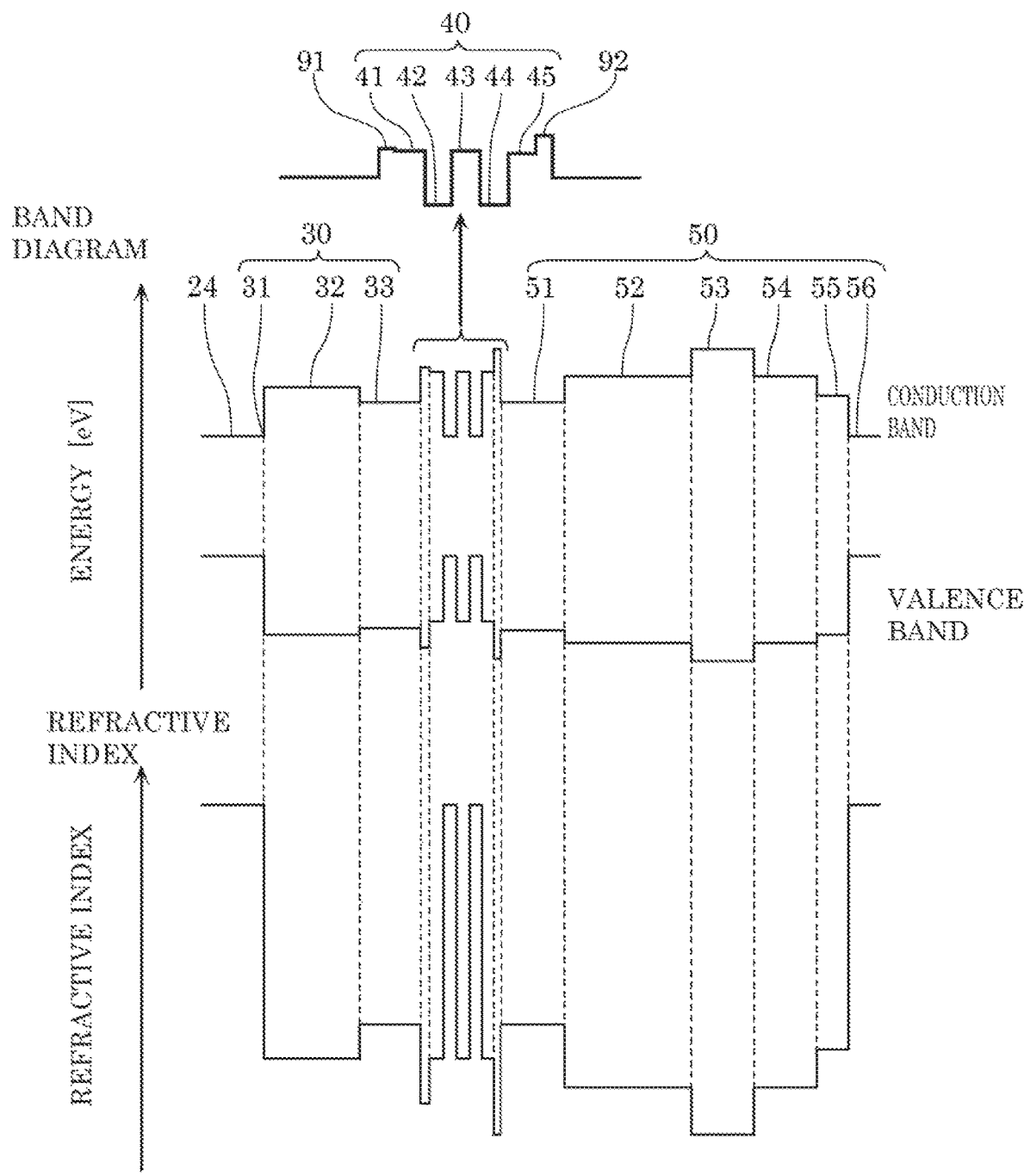
FIG. 12 is a diagram illustrating the energy band structure and the refractive index distribution of a semiconductor laser element according to Variation 1 of Embodiment 1.

FIG. 12 is a diagram illustrating the energy band structure and the refractive index distribution of the semiconductor laser element according to the present variation. The semiconductor laser element according to the present variation further includes hole barrier layer 91 and electron barrier layer 92 in addition to the components in semiconductor laser element 14 according to Embodiment 1.

The semiconductor laser element according to the present variation includes hole barrier layer 91 that is disposed between n-type cladding layer 32 and active layer 40 and has an energy band gap larger than that of n-type cladding layer 32. In the example shown in FIG. 12, the semiconductor laser element includes hole barrier layer 91 between n-side light guide layer 33 and active layer 40. Hole barrier layer 91 includes an n-$(Al_{0.4}Ga_{0.6})_{0.5}In_{0.5}P$ film having a film thickness of 0.05 μm. Hole barrier layer 91 is included in first semiconductor layer 30. Hole barrier layer 91 has an energy band gap larger than that of each of barrier layers 41, 43, and 45 made of $Al_{0.59}Ga_{0.41}As$, and a film thickness that has no effect on the distribution of light confined in the stacked direction. For example, hole barrier layer 91 has a film thickness of 0.1 μm or less, and may be thinner than n-side light guide layer 33.

In this manner, hole barrier layer 91 having a large energy band gap is provided between n-side light guide layer 33 and active layer 40, thereby reducing hole leakage from active layer 40 to n-side light guide layer 33 and enhancing the effect of confining holes in active layer 40. Accordingly, it is possible to achieve high efficiency of light emission even under high-temperature operation.

The semiconductor laser element according to the present variation includes electron barrier layer 92 that is disposed between the p-type cladding layer and active layer 40 and has an energy band gap larger than that of the p-type cladding layer. In the example shown in FIG. 12, the semiconductor laser element includes electron barrier layer 92 between p-side light guide layer 51 and active layer 40. Electron barrier layer 92 includes a p-$(Al_{0.6}Ga_{0.4})_{0.5}In_{0.5}P$ film having a film thickness of 0.05 μm. Electron barrier layer 92 is included in second semiconductor layer 50. Electron barrier layer 92 has an energy band gap larger than that of each of barrier layers 41, 43, and 45 made of $Al_{0.59}Ga_{0.41}As$, and a film thickness that has no effect on the distribution of light confined in the stacked direction. For example, electron barrier layer 92 has a film thickness of 0.1 μm or less, and may be thinner than p-side light guide layer 51.

In this manner, electron barrier layer 92 having a large energy band gap is provided between p-side light guide layer 51 and active layer 40, thereby reducing electron leakage from active layer 40 to p-side light guide layer 51 and enhancing the effect of confining carriers in active layer 40.

Accordingly, it is possible to achieve high efficiency of light emission even under high-temperature operation.

It is to be noted that in the semiconductor laser element according to the present variation, the p-type cladding layer, electron barrier layer 92, p-side light guide layer 51, and n-side light guide layer 33 may contain AlGaAs.

[1-5. Variation 2]

Next, a semiconductor laser element according to Variation 2 of Embodiment 1 be described. The semiconductor laser element according to the present variation differs in the arrangement of a hole barrier layer from the semiconductor laser element according to Variation 1 of Embodiment 1, and the rest is the same. The following describes the semiconductor laser element according to the present variation with reference to FIG. 13, mainly in terms of differences from the semiconductor laser element according to Variation 1 of Embodiment 1.

Figure 13:
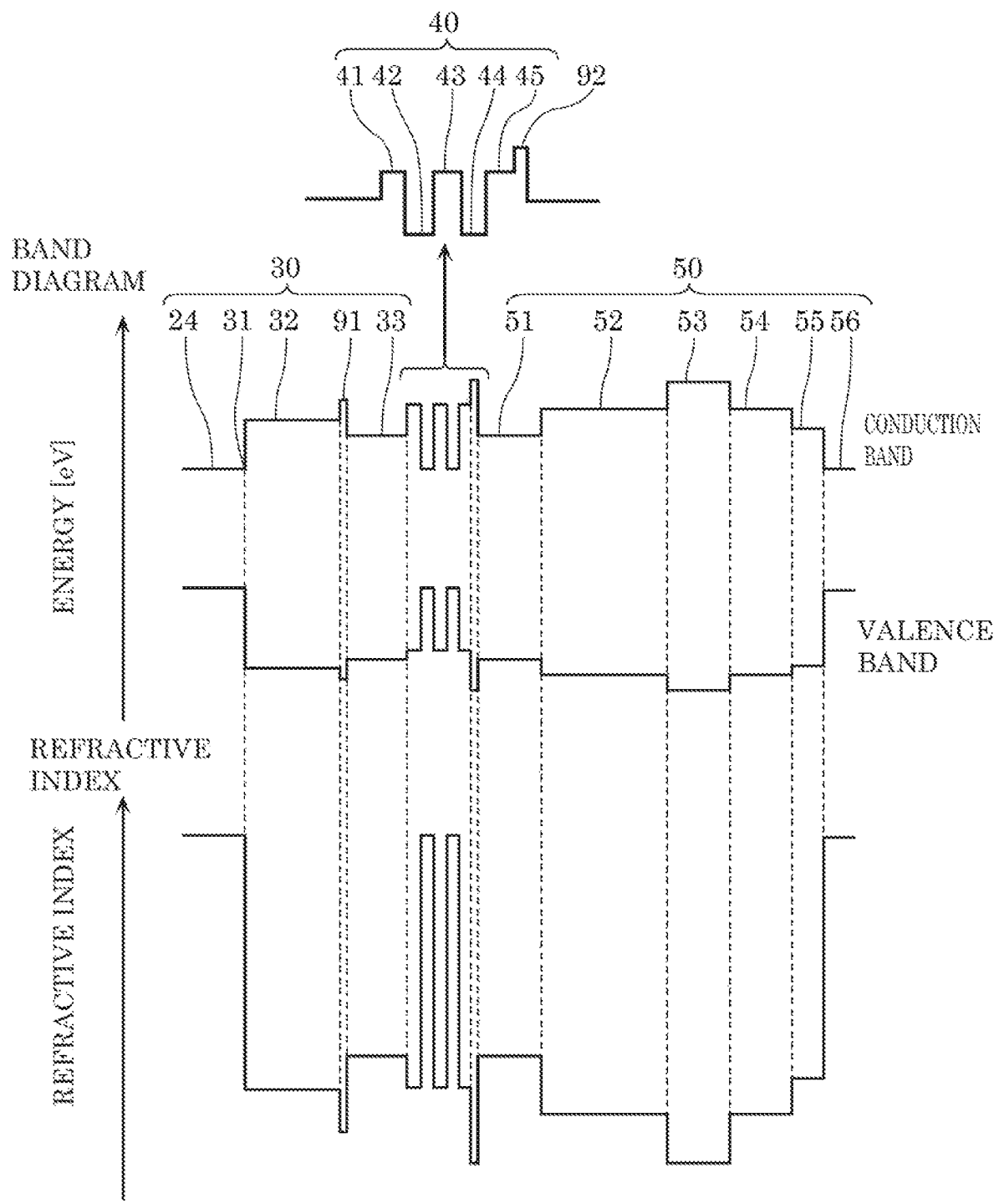
FIG. 13 is a diagram illustrating the energy hand structure and the refractive index distribution of a semiconductor laser lenient according to Variation 2 of Embodiment 2.

FIG. 13 is a diagram illustrating the energy band structure and the refractive index distribution of the semiconductor laser element according to the present variation. As shown in FIG. 13, in the semiconductor laser element according to the present variation, hole harrier layer 91 is disposed between n-type cladding layer 32 and n-side light guide layer 33.

Hole barrier layer 91 according to the present variation may have an energy band gap larger than that of n-type cladding layer 32, and a film thickness that easily allows for electron tunneling. For example, hole barrier layer 91 has a film thickness of 0.1 μm or less, and may be thinner than n-side light guide layer 33.

In this manner, hole barrier layer 91 having a large energy band gap is provided between n-type cladding layer 32 and n-side light guide layer 33, thereby reducing hole leakage from n-side light guide layer 33 to n-type cladding layer 32 and enhancing the effect of confining holes in active layer 40.

In the semiconductor laser elements according to Variation 1 and Variation 2, the hole barrier layer may contain AlGaAs. As described in Variation 1 and Variation 2, however, the hole barrier layer is made of AlGaInP, and thus a higher barrier of the valence band and a lower barrier of the conduction band are allowed. With this, it is possible to easily inject electrons into active layer 40 and simultaneously further enhance the effect of confining holes in active layer 40.

It is to be noted that in the semiconductor laser elements according to Variation 1 and Variation 2, the p-type cladding layer, electron barrier layer 92, p-side light guide layer 51, and n-side light guide layer 33 may contain AlGaAs.

Embodiment 2

A semiconductor laser element according to Embodiment 2 will be described. The semiconductor laser element according to the present embodiment mainly differs in the structure of an active layer from semiconductor laser element 14 according to Embodiment 1. The following describes the semiconductor laser element according to the present embodiment with reference to FIG. 14 and FIG. 15, mainly in terms of differences from semiconductor laser element 14 according to Embodiment 1.

Figure 15:
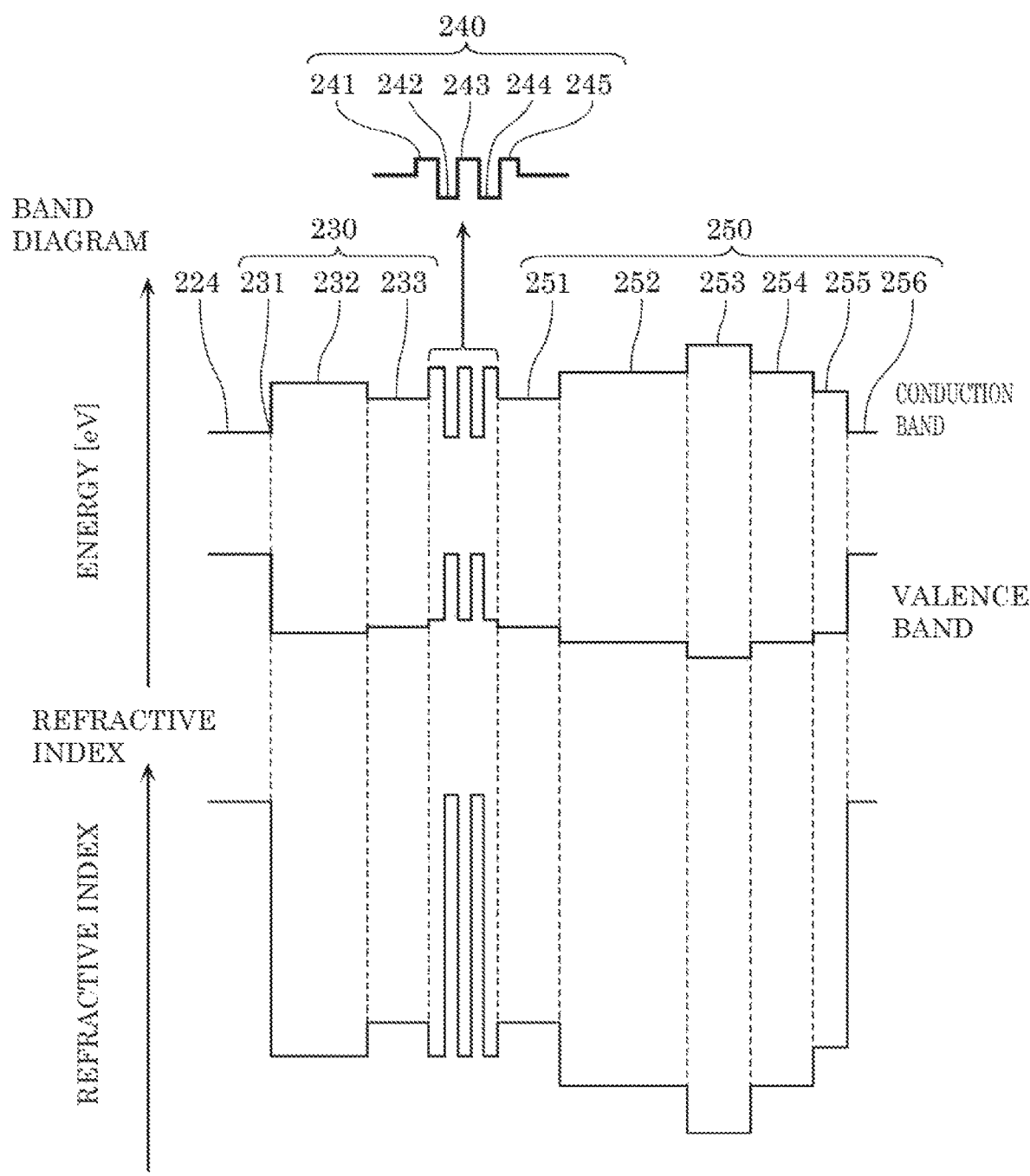
FIG. 15 is a diagram illustrating the energy band structure and the refractive index distribution of the semiconductor laser element according to Embodiment 2.

FIG. 14 is a table illustrating the layer structure of the semiconductor laser element according to the present embodiment. FIG. 15 is a diagram illustrating the energy band structure and the refractive index distribution of the semiconductor laser element according to the present embodiment. As shown in FIG. 15, the semiconductor laser element according to the present embodiment includes chip-like substrate 224, first semiconductor layer 230, active layer 240, and second semiconductor layer 250 in the same manner as semiconductor laser element 14 according to Embodiment 1. First semiconductor layer 230 includes n-type buffer layer 231, n-type cladding layer 232, and n-side light guide layer 233. Active layer 240 includes well layers 242 and 244, and barrier layers 241, 243, and 245. Second semiconductor layer 250 includes p-side light guide layer 251, p-type first cladding layer 252, p-type second cladding layer 253, p-type third cladding layer 254, p-type interlayer 255, and p-type contact layer 256.

Moreover, the semiconductor laser element according to the present embodiment differs in the structures of barrier layer 241, well layers 242 and 244, and n-type cladding layer 232 from semiconductor laser element 14 according to Embodiment 1.

Barrier layer 241 according to the present embodiment is an $Al_{0.59}Ga_{0.41}As$ layer having a film thickness of 0.024 μm. Well layers 242 and 244 are each an $In_{0.03}Ga_{0.97}As$ layer having a film thickness of 0.0055 μm N-type cladding layer 232 is an n-$(Al_{0.17}Ga_{0.83})_{0.5}In_{0.5}P$ layer having a film thickness of 4.7 μm.

The semiconductor laser element according to the present embodiment includes active layer 240 as described above, thereby achieving TE-mode oscillation with an oscillation wavelength of at least 830 nm and at most 860 nm.

Also in the semiconductor laser element according to the present embodiment, like semiconductor laser element 14 according to Embodiment 1, the energy band gap of each of barrier layers 241, 243, and 245 (2.042 eV) is larger than that of n-type cladding layer 232 (1.976 eV), and the refractive index of each of barrier layers 241, 243, and 245 (3.211) is higher than that of n-type cladding layer 232 (3.204). Accordingly, the semiconductor laser element according to the present embodiment can produce the same effect as semiconductor laser element 14 according to Embodiment 1.

Embodiment 3

A semiconductor laser element according to Embodiment 3 will be described. The semiconductor laser element according to the present embodiment mainly differs in the structure of an active layer from semiconductor laser element 14 according to Embodiment 1. The semiconductor laser element according to the present embodiment can implement TM-mode oscillation. The following describes the semiconductor laser element according to the present embodiment with reference to FIG. 16 and FIG. 17, mainly in terms of differences from semiconductor laser element 14 according to Embodiment 1.

Figure 17:
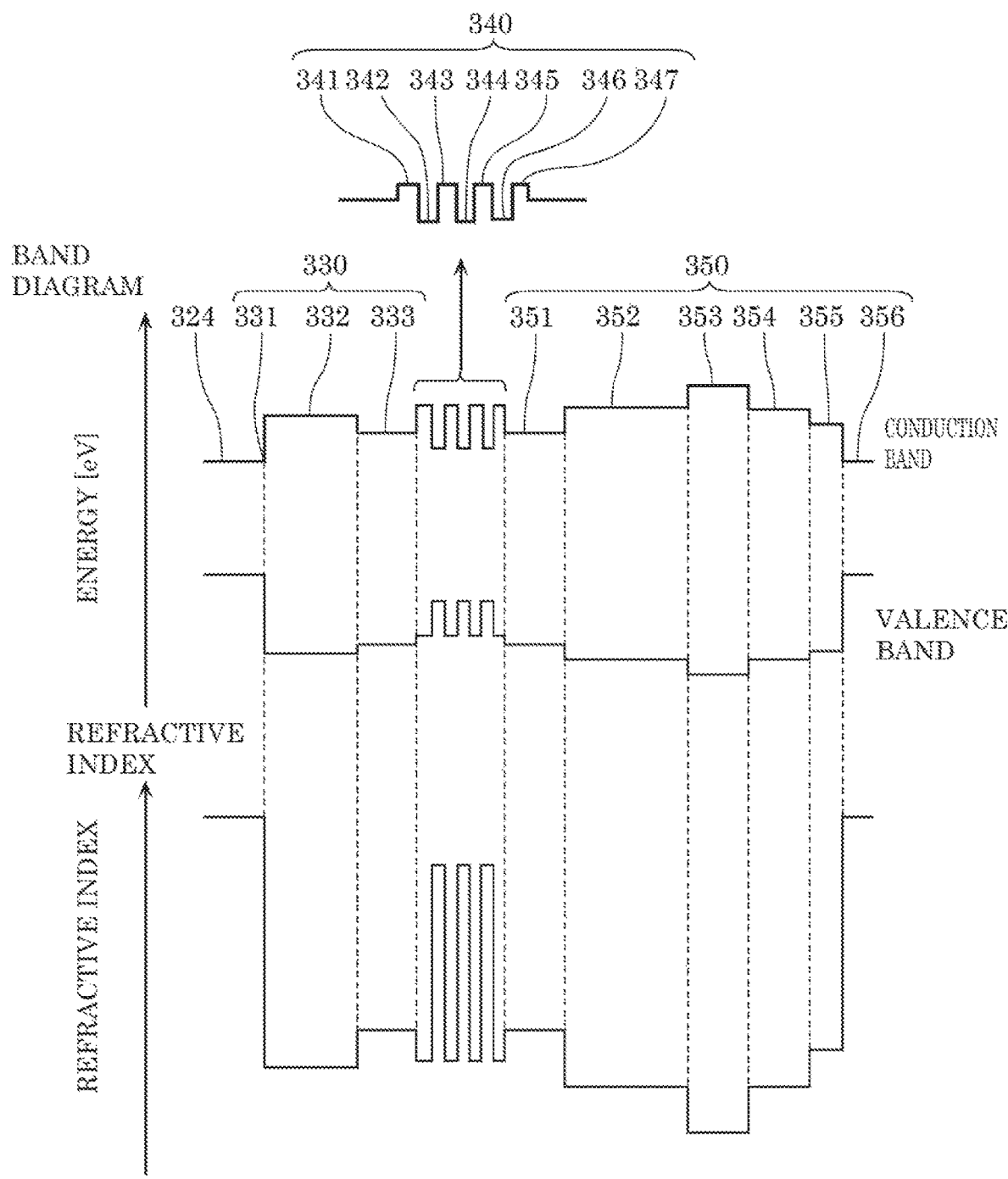
FIG. 17 is a diagram illustrating the energy band structure and the refractive index distribution of the semiconductor laser element according to Embodiment 3.

FIG. 16 is a table illustrating the layer structure of the semiconductor laser element according to the present embodiment, FIG. 17 is a diagram illustrating the energy band structure and the refractive index distribution of the semiconductor laser element according to the present embodiment. As shown in FIG. 17, the semiconductor laser element according to the present embodiment includes chip-like substrate 324, first semiconductor layer 330, active layer 340, and second semiconductor layer 350 in the same manner as semiconductor laser element 14 according to Embodiment 1. First semiconductor layer 330 includes n-type buffer layer 331, n-type cladding layer 332, and n-side light guide layer 333. Active layer 340 includes well layers 342, 344, and 346, and barrier layers 341, 343, 345, and 347. Second semiconductor layer 350 includes p-side light guide layer 351, p-type first cladding layer 352, p-type second cladding layer 353, p-type third cladding layer 354, p-type interlayer 355, and p-type contact layer 356.

As described above, the semiconductor laser element according to the present embodiment differs from semiconductor laser element 14 according to Embodiment 1 in the structures of barrier layers 341, 343, 345, and 347 and well layers 342, 344, and 346, and the structures of n-type cladding layer 332 and p-type first cladding layer 352.

In active layer 340 according to the present embodiment, the number of barrier layers 341, 343, 345, and 347 and the number of well layers 342, 344, and 346 are each greater than that of semiconductor laser element 14 according to Embodiment 1. Moreover, the material forming each well layer is different from that of semiconductor laser element 14 according to Embodiment 1. Barrier layer 341 according to the present embodiment is an $Al_{0.59}Ga_{0.41}As$ layer having a film thickness of 0.04 µm. Barrier layer 343 and barrier layer 345 are each an $Al_{0.59}Ga_{0.41}As$ layer having a film thickness of 0.008 µm. Barrier layer 347 is an $Al_{0.59}Ga_{0.41}As$ layer having a film thickness of 0.021 µm. Well layers 342, 344, and 346 are each a $GaAs_{0.84}P_{0.16}$ layer having a film thickness of 0.0065 µm.

N-type cladding layer 332 is an n-$(Al_{0.19}Ga_{0.81})_{0.5}In_{0.5}P$ layer having a film thickness of 4.7 µm. P-type first cladding layer 352 is an n-$(Al_{0.30}Ga_{0.70})_{0.5}In_{0.5}P$ layer having a film thickness of 0.16 µm.

Also in the semiconductor laser element according to the present embodiment, like semiconductor laser element 14 according to Embodiment 1, the energy band gap of each of barrier layers 341, 343, 345, and 347 (2.042 eV) is larger than that of n-type cladding layer 332 (1.986 eV), and the refractive index of each of barrier layers 341, 343, 345, and 347 (3.211) is higher than that of n-type cladding layer 332 (3.198). Accordingly, the semiconductor laser element according to the present embodiment can produce the same effect as semiconductor laser element 14 according to Embodiment 1.

Embodiment 4

A semiconductor laser element according to Embodiment 4 will be described. The semiconductor laser element according to the present embodiment differs from semiconductor laser element 14 according to Embodiment 1 in that a graded buffer layer and a graded interlayer are provided. The following describes the semiconductor laser element according to the present embodiment with reference to FIG. 18 and FIG. 19, mainly in terms of differences from semiconductor laser element 14 according to Embodiment 1.

Moreover, in Embodiment 4, the resonator length is 260 µm. Here, the resonator length of semiconductor laser element 14 is set to 260 µm, and thus a ratio of a region other than window region 80 to waveguide WG can be reduced, thereby reducing saturation light output power. Accordingly, it is possible to prevent end-face damage of semiconductor laser element 14.

Figure 19:
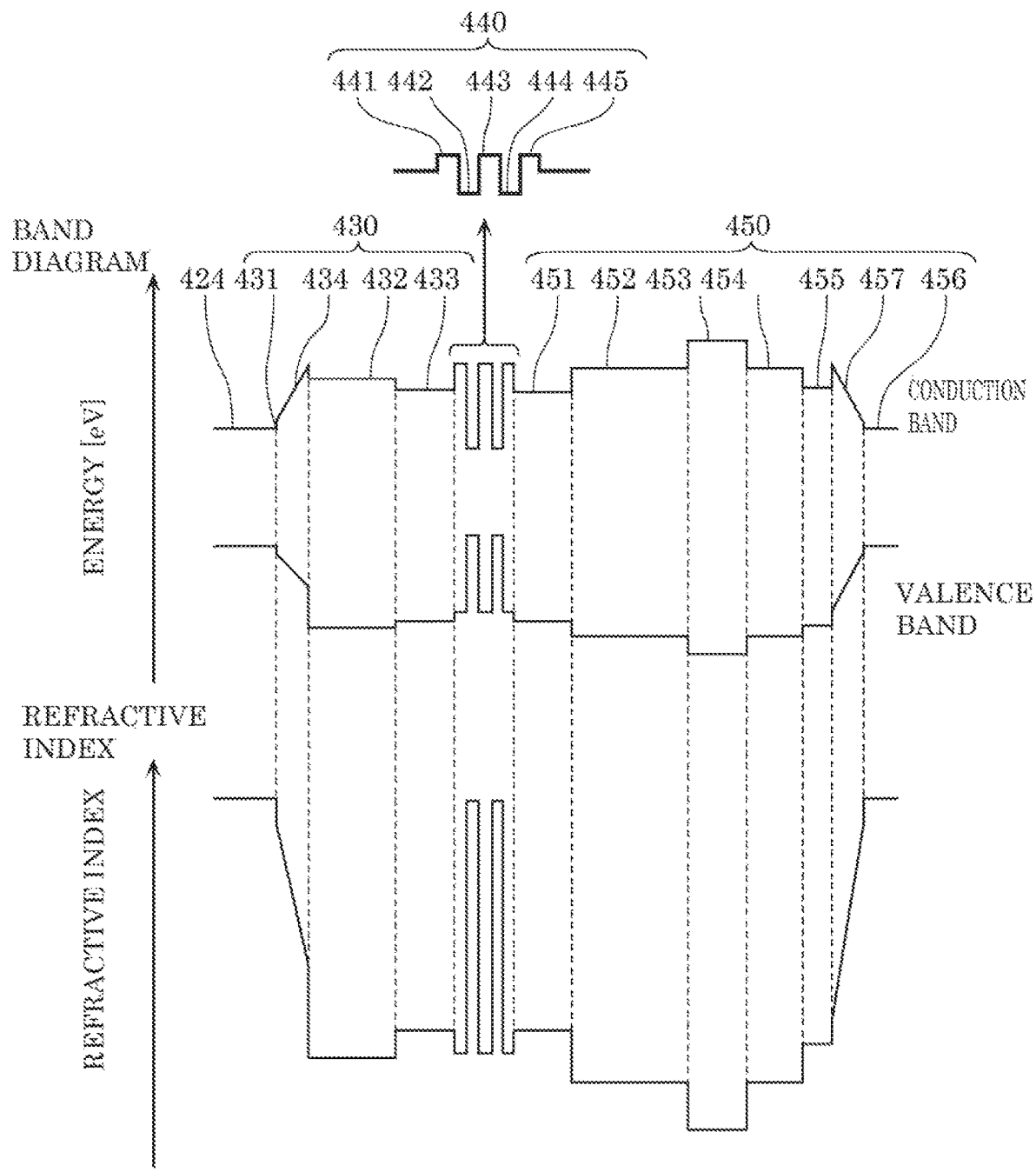
FIG. 19 is a diagram illustrating the energy band structure and the refractive index distribution of the semiconductor laser element according to Embodiment 4.

FIG. 18 is a table illustrating the layer structure of the semiconductor laser element according to the present embodiment. FIG. 19 is a diagram illustrating the energy band structure and the refractive index distribution of the semiconductor laser element according to the present embodiment. As shown in FIG. 19, the semiconductor laser element according to the present embodiment includes chip-like substrate 424, first semiconductor layer 430, active layer 440, and second semiconductor layer 450 in the same manner as semiconductor laser element 14 according to Embodiment 1. First semiconductor layer 430 includes n-type buffer layer 431, graded buffer layer 434, n-type cladding layer 432, and n-side light guide layer 433. Active layer 440 includes well layers 442 and 444, and barrier layers 441, 443, and 445. Second semiconductor layer 450 includes p-side light guide layer 451, p-type first cladding layer 452, p-type second cladding layer 453, p-type third cladding layer 454, p-type interlayer 455, graded interlayer 457, and p-type contact layer 456.

Graded buffer layer 434 according to the present embodiment is an $Al_xGa_{1-x}As$ layer having a film thickness of 0.075 µm, and the Al composition ratio gradually changes in the stacked direction. More specifically, from the interface with n-type buffer layer 431 to the interface with n-type cladding layer 432, the Al composition ratio of graded buffer layer 434 gradually changes from x=0.05 to x=0.35. With this, it is possible to smooth a spike-like hetero barrier generated between chip-like substrate 424 and n-type cladding layer 432. Accordingly, it is possible to reduce the operating voltage of the semiconductor laser element.

Moreover, graded interlayer 457 according to the present embodiment is a p-$Al_xGa_{1-x}As$ layer having a film thickness of 0.05 µm, and the Al composition ratio gradually changes in the stacked direction. More specifically, from the interface with p-type interlayer 455 to the interface with p-type contact layer 456, the Al composition ratio of graded interlayer 457 gradually changes from x=0.55 to x=0.05. With this, it is possible to smooth a spike-like hetero barrier generated between p-type interlayer 455 and p-type contact layer 456. Accordingly, it is possible to reduce the operating voltage of the semiconductor laser element.

The semiconductor laser element according to the present embodiment also differs in the structures of n-side light guide layer 433 and p-side light guide layer 451 from the semiconductor laser element according to Embodiment 1. N-side light guide layer 433 according to the present embodiment is an $(Al_{0.04}Ga_{0.96})_{0.5}In_{0.5}P$ layer having a film thickness of 0.09 µm. It is to be noted that the Al composition ratio of aside light guide layer 433 may gradually change in the stacked direction. For example, n-side light guide layer 433 may be an $(Al_xGa_{1-x})_{0.5}In_{0.5}P$ layer, and from the interface with n-type cladding layer 432 to the interface with active layer 440, the Al composition ratio may gradually change from x=0.18 to x=0.02.

P-side light guide layer 451 according to the present embodiment is an $(Al_{0.04}Ga_{0.96})_{0.5}In_{0.5}P$ layer having a film thickness of 0.07 µm. It is to be noted that the Al composition ratio of p-side light guide layer 451 may gradually change in the stacked direction. For example, p-side light guide layer 451 may be an $(Al_xGa_{1-x})_{0.5}In_{0.5}P$ layer, and from the interface with active layer 440 to the interface with p-type first cladding layer 452, the Al composition ratio may gradually change from x=0.02 to x=0.30.

Also in the semiconductor laser element according to the present embodiment, like semiconductor laser element 14 according to Embodiment 1, the energy band gap of each of barrier layers 441, 443, and 445 (2.042 eV) is larger than that of n-type cladding layer 432 (1.981 eV), and the refractive index of each of barrier layers 441, 443, and 445 (3.211) is higher than that of n-type cladding layer 432 (3.201). Accordingly, the semiconductor laser element according to the present embodiment can produce the same effect as semiconductor laser element 14 according to Embodiment 1.

Embodiment 5

A semiconductor laser element according to Embodiment 5 will be described. The semiconductor laser element according to the present embodiment mainly differs in the shape of a waveguide and the structure of an active layer from the semiconductor laser element according to Embodiment 4. The semiconductor laser element according to the present embodiment achieves an oscillation wavelength of 980 nm. The following describes the semiconductor laser element according to the present embodiment, mainly in terms of differences from the semiconductor laser element according to Embodiment 4.

Figure 20:
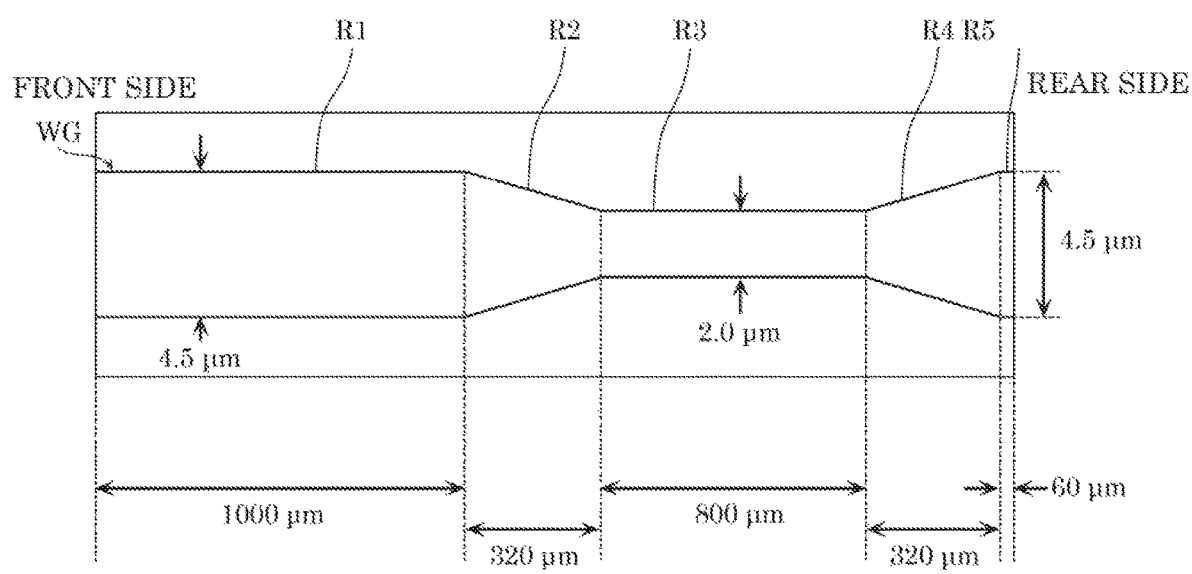
FIG. 20 is a top view illustrating the shape of a waveguide of a semiconductor laser element according to Embodiment 5.

Firstly, the shape of the waveguide of the semiconductor laser element according to the present; embodiment will be described with reference to FIG. 20. FIG. 20 is a top view illustrating the shape of the waveguide of the semiconductor laser element according to the present embodiment. FIG. 20 illustrates waveguide WG when viewed from the p-side upper electrode in the semiconductor laser element according to the present embodiment. It is to be noted that in the present embodiment, the resonator length is 2500 μm.

As shown in FIG. 20, waveguide WG in the semiconductor laser element according to the present embodiment includes first region. R1 through fifth region R5 from the front side (from which light is emitted) toward the rear side. Firstly, first region R1 has a length a length in the resonance direction) of 1000 μm and a constant waveguide width (i.e., a dimension in a direction perpendicular to the resonance direction and parallel to the main surface of chip-like substrate 524) of 4.5 μm. Second region R2 has a length of 320 μm and a waveguide width that continuously decreases from 4.5 μm to 2.0 μm from first region R1 toward third region R3 from the front side toward the rear side). Third region R3 has a length of 800 μm and a constant waveguide width of 2.0 μm. Fourth region R4 has a length of 320 μm and a waveguide width that continuously increases from 2.0 μm to 4.5 μm from third region. R3 toward fifth region R5 (i.e., from the front side toward the rear side). Fifth region R5 has a length of 60 μm and a constant waveguide width of 4.5 μm.

In this manner, the waveguide width is widened on the front side of waveguide WG, and thus it is possible to increase an amount of injected current, thereby achieving high light output power. Moreover, a single mode operation is implemented by providing, between the front side and the rear side, a waveguide width region (third region R3) where transverse higher order mode light can be cut off. Moreover, a region having a waveguide width of 4.5 μm and a region having a waveguide width of 2.0 μm are connected by a 320 μm length region having a continuously changing waveguide width, and thus it is possible to reduce propagation loss of laser light due to a change in the waveguide width.

Accordingly, it is possible to achieve a single mode semiconductor laser element capable of performing a high-power operation.

Figure 22:
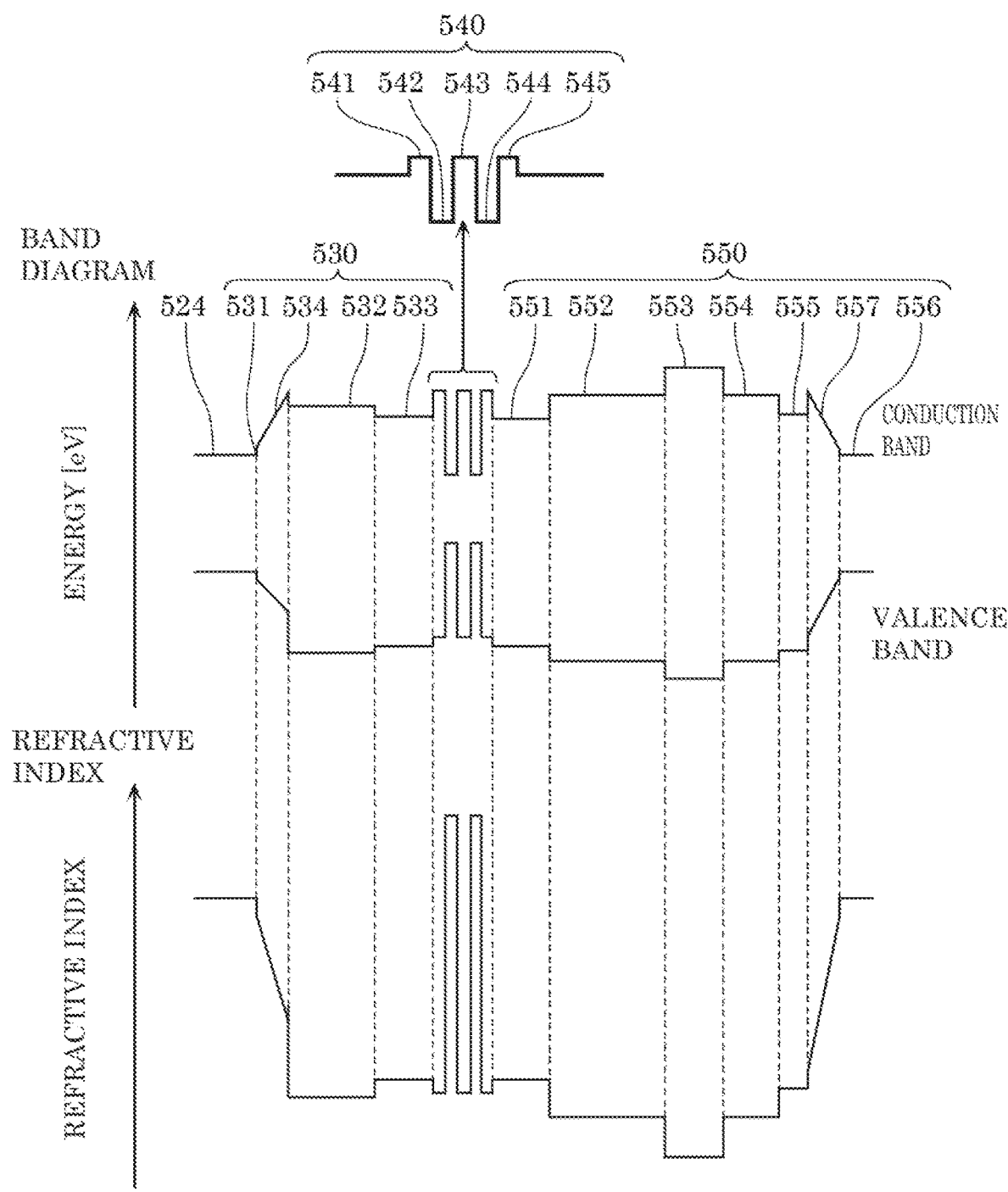
FIG. 22 is a diagram illustrating the energy band structure and the refractive index distribution of the semiconductor laser element according to Embodiment 5.

Next, the following describes the structure of the active layer in the semiconductor laser element according to the present embodiment with reference to FIG. 21 and FIG. 22. FIG. 21 is a table illustrating the layer structure of the semiconductor laser element according to the present embodiment. FIG. 22 is a diagram illustrating the energy band structure and the refractive index distribution of the semiconductor laser element according to the present embodiment. As shown in FIG. 22, the semiconductor laser element according to the present embodiment includes chip-like substrate 524, first semiconductor layer 530, active layer 540, and second semiconductor layer 550 in the same manner as the semiconductor laser element according to Embodiment 4. First semiconductor layer 530 includes n-type buffer layer 531, graded buffer layer 534, n-type cladding layer 532, and n-side light guide layer 533. Active layer 540 includes well layers 542 and 544, and barrier layers 541, 543, and 545. Second semiconductor layer 550 includes p-side light guide layer 551, p-type first cladding layer 552, p-type second cladding layer 553, p-type third cladding layer 554, p-type interlayer 555, graded interlayer 557, and p-type contact layer 556.

Moreover, the semiconductor laser element according to the present embodiment differs in the structures of active layer 540, n-side light guide layer 533, p-side light guide layer 551, and p-type first cladding layer 552 from the semiconductor laser element according to Embodiment 4.

Well layers 542 and 544 in active layer 540 according to the present embodiment are each an $In_{0.17}Ga_{0.83}As$ layer having a film thickness of 0.008 μm. Barrier layer 541 is an $Al_{0.59}Ga_{0.41}As$ layer having a film thickness of 0.03 μm. Barrier layer 543 is an $Al_{0.59}Ga_{0.41}As$ layer having a film thickness of 0.007 μm. Barrier layer 545 is an $Al_{0.59}Ga_{0.41}As$ layer having a film thickness of 0.021 μm. The semiconductor laser element according to the present embodiment includes active layer 540 as described above, thereby achieving an oscillation wavelength of 980 nm.

N-side light guide layer 533 according to the present embodiment is an $(Al_{0.04}Ga_{0.96})_{0.5}In_{0.5}P$ layer having a film thickness of 0.085 μm. It should be noted that the Al composition ratio of n-side light guide layer 533 may gradually change in the stacked direction in the same manner as n-side light guide layer 433 according to Embodiment 4.

P-side light guide layer 551 according to the present embodiment is an $(Al_{0.04}Ga_{0.96})_{0.5}In_{0.5}P$ layer having a film thickness of 0.13 μm. It is to be noted that the Al composition ratio of p-side light guide layer 451 may gradually change in the stacked direction in the same manner as p-side light guide layer 451 according to Embodiment 4.

P-type first cladding layer 552 according to the present embodiment is a p-$(Al_{0.04}Ga_{0.96})_{0.5}In_{0.5}P$ layer having a film thickness of 0.20 μm.

Also in the semiconductor laser element according to the present embodiment, like the semiconductor laser element according to Embodiment 4, the energy band gap of each of barrier layers 541, 543, and 545 (2.042 eV) is larger than that of n-type cladding layer 532 (1.973 eV), and the refractive index of each of barrier layers 541, 543, and 545 (3.211) is higher than that of n-type cladding layer 532 (3.206). Accordingly, the semiconductor laser element according to the present embodiment can produce the same effect as the semiconductor laser element according to Embodiment 4.

Embodiment 6

A semiconductor laser element according to Embodiment 6 will be described. The semiconductor laser element according to the present embodiment differs in the structures of a p-type first cladding layer, a p-side light guide layer, a barrier layer, an n-side light guide layer, and an n-type cladding layer from the semiconductor laser element according to Embodiment 4, and the other structures are the same. The following describes the semiconductor laser element according; to the present embodiment with reference to FIG. 23 and FIG. 24, mainly in terms of differences from the semiconductor laser element according to Embodiment 4.

Figure 24:
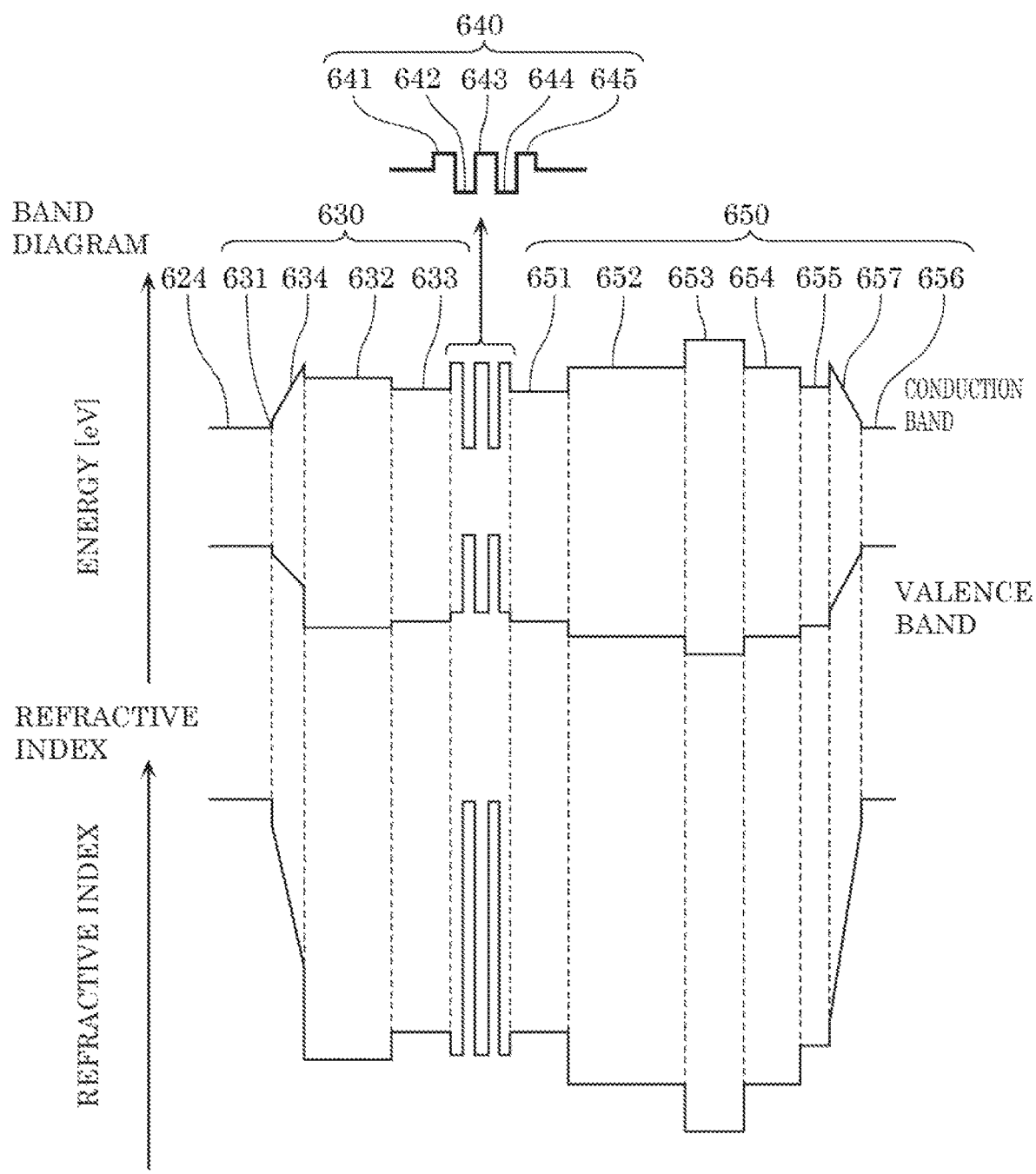
FIG. 24 is a diagram illustrating the energy band structure and the refractive index distribution of the semiconductor laser element according to Embodiment 6.

FIG. 23 is a table illustrating the layer structure of the semiconductor laser element according to the present embodiment. FIG. 24 is a diagram illustrating the energy band structure and the refractive index distribution of the semiconductor laser element according to the present embodiment. As shown in FIG. 24, the semiconductor laser element according to the present embodiment includes chip-like substrate 624, first semiconductor layer 630, active layer 640, and second semiconductor layer 650 in the same manner as the semiconductor laser element according to Embodiment 4. First semiconductor layer 630 includes n-type buffer layer 631, graded buffer layer 634, n-type cladding layer 632, and n-side light guide layer 633. Active layer 640 includes well layers 642 and 644, and barrier layers 641, 643, and 645. Second semiconductor layer 650 includes p-side light guide layer 651, p-type first cladding layer 652, p-type second cladding layer 653, p-type third cladding layer 654, p-type interlayer 655, graded interlayer 657, and p-type contact layer 656.

As shown in FIG. 23, p-type first cladding layer 652 according to the present embodiment is a p-$(Al_{0.29}Ga_{0.71})_{0.5}In_{0.5}P$ layer, and has the Al composition ratio lower than that of p-type first cladding layer 452 according to Embodiment 4. With this, p-type first cladding layer 652 has a refractive index higher than that of p-type first cladding layer 452 according to Embodiment 4, and thus it is possible to enhance the effect of confining light in active layer 640. The Al composition ratio of p-type first cladding layer 652 may be lower than that of p-type second cladding layer 653 and that of p-type third cladding layer 654, for example. With this, it is possible to produce the above-mentioned light confinement effect.

P-side light guide layer 651 according to the present embodiment has a film thickness of 0.13 μm which is greater than that of p-side light guide layer 451 according to Embodiment 4. With this, the center portion of the light distribution in the stacked direction is located closer to active layer 640, and thus it is possible to enhance the effect of confining light in active layer 640.

Among the barrier layers in active layer 640 according to the present embodiment, barrier layer 641 closest to first semiconductor layer 630 has a film thickness of 0.02 μm which is smaller than that of barrier layer 441 according to Embodiment 4. Moreover, n-side light guide layer 633 according to the present embodiment has a film thickness of 0.05 μm which is smaller than that of n-side light guide layer 433 according to Embodiment 4. Moreover, n-type cladding layer 632 according to the present embodiment has a film thickness of 3.2 μm which is smaller than that of n-type cladding layer 432 according to Embodiment 4. As described above, the distance between chip-like substrate 624 and the center portion of active layer 640 in the stacked direction can be reduced by decreasing the film thickness of barrier layer 641 on first semiconductor layer 630 side of active layer 640 and the film thickness of each layer in first semiconductor layer 630. Accordingly, it is possible to increase a part of the tail portion of the light distribution which is located in chip-like substrate 624. Here, the impurity concentration of chip-like substrate 624 is higher than that of n-type cladding layer 632 or the like, and thus light loss is high in chip-like substrate 624. Here, this light distribution may include transverse higher order mode light in addition to transverse base mode light. The effective refractive index of the transverse higher order mode light is lower than that of the transverse base mode light, and thus the light distribution spreads toward chip-like substrate 624. Accordingly, in the semiconductor laser element according to the present embodiment, the loss of transverse higher order mode light in chip-like substrate 624 is greater than that of the semiconductor laser element according to Embodiment 4, and thus the transverse higher order mode light can be attenuated. With this, it is possible to suppress the instability of light output power due to the transverse higher order mode light and the instability of the shape of the light emission distribution.

Moreover, n-type cladding layer 632 according to the present embodiment is an n-$(Al_{0.155}Ga_{0.845})_{0.5}In_{0.5}P$ layer, and has an Al composition ratio lower than that of n-type cladding layer 432 according to Embodiment 4. With this, n-type cladding layer 632 has a refractive index higher than that of n-type cladding layer 432 according to Embodiment 4, and thus it is possible to enhance the effect of confining light in active layer 640.

As described above, in comparison to the semiconductor laser element according to Embodiment 4, the semiconductor laser element according to the present embodiment can further enhance the effect of confining light in active layer 640 and reduce the transverse higher order mode light.

(Variation, Etc.)

The foregoing has described the semiconductor laser element or the like according to the present disclosure based on the embodiments, yet the present disclosure is not limited to the embodiments described above.

For example, the present disclosure also includes embodiments as a result of adding various modifications that may be conceived by those skilled in the art to the embodiments, and embodiments obtained by combining elements and functions in the embodiments in any manner as long as the combination does not depart from the spirit of the present disclosure.

Moreover, in the semiconductor laser elements according to the above-mentioned embodiments and their variations, the waveguide is formed using a ridge structure. However, the method of forming the waveguide is not limited to this, and an embedded structure or the like is possible.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The semiconductor laser element according to the present disclosure is particularly applicable to various light sources that are required to reduce power consumption.

What is claimed is:

1. A semiconductor laser element, comprising:
an n-type cladding layer disposed above an n-type semiconductor substrate;
an active layer disposed above the n-type cladding layer; and
a p-type cladding layer disposed above the active layer, wherein
the active layer includes a well layer and a barrier layer,
an energy band gap of the barrier layer is larger than an energy band gap of the n-type cladding layer, and
a refractive index of the barrier layer is higher than a refractive index of the n-type cladding layer.

2. The semiconductor laser element according to claim 1, wherein
the n-type cladding layer contains $Al_{x1}Ga_{1-x1-y1}In_{y1}As_{1-z1}P_{z1}$,
the barrier layer contains $Al_{x2}Ga_{1-x2-y2}In_{y2}As_{1-z2}P_{z2}$, and $z1 > z2$ is satisfied.

3. The semiconductor laser element according to claim 2, wherein
the n-type cladding layer contains $Al_{x1}Ga_{1-x1-y1}In_{y1}$, and the barrier layer contains $Al_{x2}Ga_{1-x2-y2}In_{y2}As$.

4. The semiconductor laser element according to claim 3, wherein
x1<x2 is satisfied.

5. The semiconductor laser element according to claim 1, wherein
the n-type semiconductor substrate contains GaAs.

6. The semiconductor laser element according to claim 1, further comprising:
an n-side light guide layer disposed between the n-type cladding layer and the active layer and having a refractive index higher than the refractive index of the n-type cladding layer.

7. The semiconductor laser element according to claim 6, wherein
the n-side light guide layer includes an $(Al_xGa_{1-x})_{0.5}In_{0.5}P$ layer.

8. The semiconductor laser element according to claim 1, further comprising:
a hole barrier layer disposed between the n-type cladding layer and the active layer and having an energy band gap larger than the energy band gap of the n-type cladding layer.

9. The semiconductor laser element according to claim 8, further comprising:
an n-side light guide layer disposed between the n-type cladding layer and the active layer and having a refractive index higher than the refractive index of the n-type cladding layer.

10. The semiconductor laser element according to claim 9, wherein
a film thickness of the hole barrier layer is thinner than a film thickness of the n-side light guide layer.

11. The semiconductor laser element according to claim 9, wherein
the hole barrier layer is disposed between the n-side light guide layer and the active layer.

12. The semiconductor laser element according to claim 9, wherein
the hole barrier layer is disposed between the n-type cladding layer and the n-side light guide layer.

13. The semiconductor laser element according to claim 9, wherein
the energy band gap of the hole barrier layer is larger than the energy band gap of the barrier layer.

14. The semiconductor laser element according to claim 9, wherein
the hole barrier layer is made of an AlGaInP-based semiconductor.

15. The semiconductor laser element according to claim 1, wherein
an energy band gap of the p-type cladding layer is larger than the energy band gap of the barrier layer.

16. The semiconductor laser element according to claim 1, wherein
the p-type cladding layer includes a p-type first cladding layer and a p-type second cladding layer, the p-type first cladding layer is disposed closer to the active layer than the p-type second cladding layer is, and
an Al composition ratio of the p-type first cladding layer is lower than an Al composition ratio of the p-type second cladding layer.

17. The semiconductor laser element according to claim 1, wherein
the energy band gap of the n-type cladding layer is larger than an energy band gap of the n-type semiconductor substrate.

18. The semiconductor laser element according to claim 1, further comprising:
a buffer layer disposed between the n-type semiconductor substrate and the n-type cladding layer, wherein
the buffer layer contains $Al_xGa_{1-x}As$.

19. The semiconductor laser element according to claim 1, further comprising:
an electron barrier layer disposed between the p-type cladding layer and the active layer and having an energy band gap larger than an energy band gap of the p-type cladding layer.

20. The semiconductor laser element according to claim 19, wherein
the well layer is made of an InGaAs-based semiconductor.

* * * * *